US011263363B2

(12) United States Patent
Gifford

(10) Patent No.: US 11,263,363 B2
(45) Date of Patent: Mar. 1, 2022

(54) DYNAMIC GENERATION AND MODIFICATION OF A DESIGN MODEL OF A BUILDING FOR A CONSTRUCTION PROJECT

(71) Applicant: ANGL LLC, Kirkland, WA (US)

(72) Inventor: Cameron Gifford, Kirkland, WA (US)

(73) Assignee: ANGL LLC, Kirkland, WA (US)

( * ) Notice: Subject to any disclaimer, the term of this patent is extended or adjusted under 35 U.S.C. 154(b) by 32 days.

(21) Appl. No.: 17/096,729

(22) Filed: Nov. 12, 2020

(65) Prior Publication Data
US 2021/0365602 A1 Nov. 25, 2021

Related U.S. Application Data

(60) Provisional application No. 63/028,864, filed on May 22, 2020.

(51) Int. Cl.
*G06F 30/13* (2020.01)
*G06N 20/00* (2019.01)
*G06T 17/00* (2006.01)

(52) U.S. Cl.
CPC .......... *G06F 30/13* (2020.01); *G06N 20/00* (2019.01); *G06T 17/00* (2013.01)

(58) Field of Classification Search
CPC .......... G06F 30/13; G06N 20/00; G06T 17/00
See application file for complete search history.

(56) References Cited

U.S. PATENT DOCUMENTS

| 6,651,037 | B1 * | 11/2003 | Hall ................ G06F 30/15 703/8 |
| 2003/0074164 | A1 * | 4/2003 | Simmons .......... F24F 11/00 703/1 |
| 2004/0060014 | A1 * | 3/2004 | Khalil ............ G06F 30/13 716/102 |

(Continued)

OTHER PUBLICATIONS

Zhang et al. "A parametric approach for performance optimization of residential building design in Beijing" Building Simulation, vol. 13, pp. 223-235 (Year: 2019).*

(Continued)

*Primary Examiner* — Rehana Perveen
*Assistant Examiner* — Alfred H B Wechselberger
(74) *Attorney, Agent, or Firm* — Norton Rose Fulbright US LLP

(57) ABSTRACT

The present disclosure provides systems, methods, and computer-readable storage devices for automatic generation of a design model of a building. To illustrate, a computing device may generate a design model, such as a three-dimensional model of a building, based on criteria and layout information. The design model may indicate a layout of one or more rooms (or other spaces), locations of one or more hallways, doors, windows, furniture, fixtures, or a combination thereof, within the building. The computing device may perform a load analysis based on the design model and enable selection of equipment to be included in the building based on the load analysis. Virtual models of the equipment, and connections between the equipment, may be automatically added to the design model by the computing device, thereby reducing user input and cost, and improving speed, associated with the building design process.

20 Claims, 8 Drawing Sheets

(56) References Cited

U.S. PATENT DOCUMENTS

| | | | | |
|---|---|---|---|---|
| 2009/0160856 | A1* | 6/2009 | Hoguet | G06F 16/904 345/420 |
| 2011/0153524 | A1* | 6/2011 | Schnackel | G06Q 10/06315 705/400 |
| 2011/0276886 | A1* | 11/2011 | Hall | G06Q 10/06 715/734 |
| 2011/0288672 | A1* | 11/2011 | Cunney | G05B 19/4093 700/104 |
| 2018/0217621 | A1* | 8/2018 | Biesterveld | G05D 23/1934 |
| 2018/0260497 | A1* | 9/2018 | Vanker | G06F 3/04815 |
| 2019/0164340 | A1* | 5/2019 | Pejic | G06F 30/13 |
| 2019/0228115 | A1* | 7/2019 | Bergin | G06N 3/0454 |
| 2020/0060007 | A1* | 2/2020 | Harrison | G06T 15/08 |

OTHER PUBLICATIONS

Shen et al. "Evaluating the Multi-Objective Optimization Methodology for Performance-Based Building Design in Professional Practice" 2018 Building Performance Analysis Conf and Sim Build, Chicago, IL (Year: 2018).*

Bahrehmand et al. "Optimizing layout using spatial quality metrics and user preferences" Graphical Models, vol. 93, pp. 25-38 (Year: 2017).*

Fisher-Gewirtzman et al. "A learning automated 3D architecture synthesis model: demonstrating a computer governed design of minimal apartment units based on human perceptual and physical needs" Architectural Science Review, vol. 62, No. 4, pp. 301-312 (Year: 2019).*

Megri, A. "Capstone Course: HVAC Systems Design at University of Wyoming" 2011 ASEE Annual Conference [ retrieved on Jan. 26, 2021]. Retrieved from <https://www.researchgate.net/publication/274897646_CAPSTONE_COURSE_HVAC_SYSTEMS_DESIGN_AT_UNIVERSITY_OF_WYOMING> (Year: 2011).*

Berseth et al. "Interactive Architectural Design with Diverse Solution Exploration" IEEE Transactions on Visualization and Computer Graphics, vol. 27, No. 1, Jan. 2021 [retrieved on Oct. 6, 2021] (Year: 2019).*

Webb, R. "Interactive Computer Modeling of the Building Design Development Process" [Thesis] Oklahoma State University [retrieved on Oct. 6, 2021] (Year: 1984).*

Tobin, K. "Constraint-Based Three-Dimensional Modeling as a Design Tool" Reality and Virtual Reality [ACADIA Conference Proceedings, Los Angeles (California—USA) Oct. 1991, pp. 193-209; ISBN 1-880250-00-4 [retrieved on Oct. 6, 2021] (Year: 1991).*

* cited by examiner

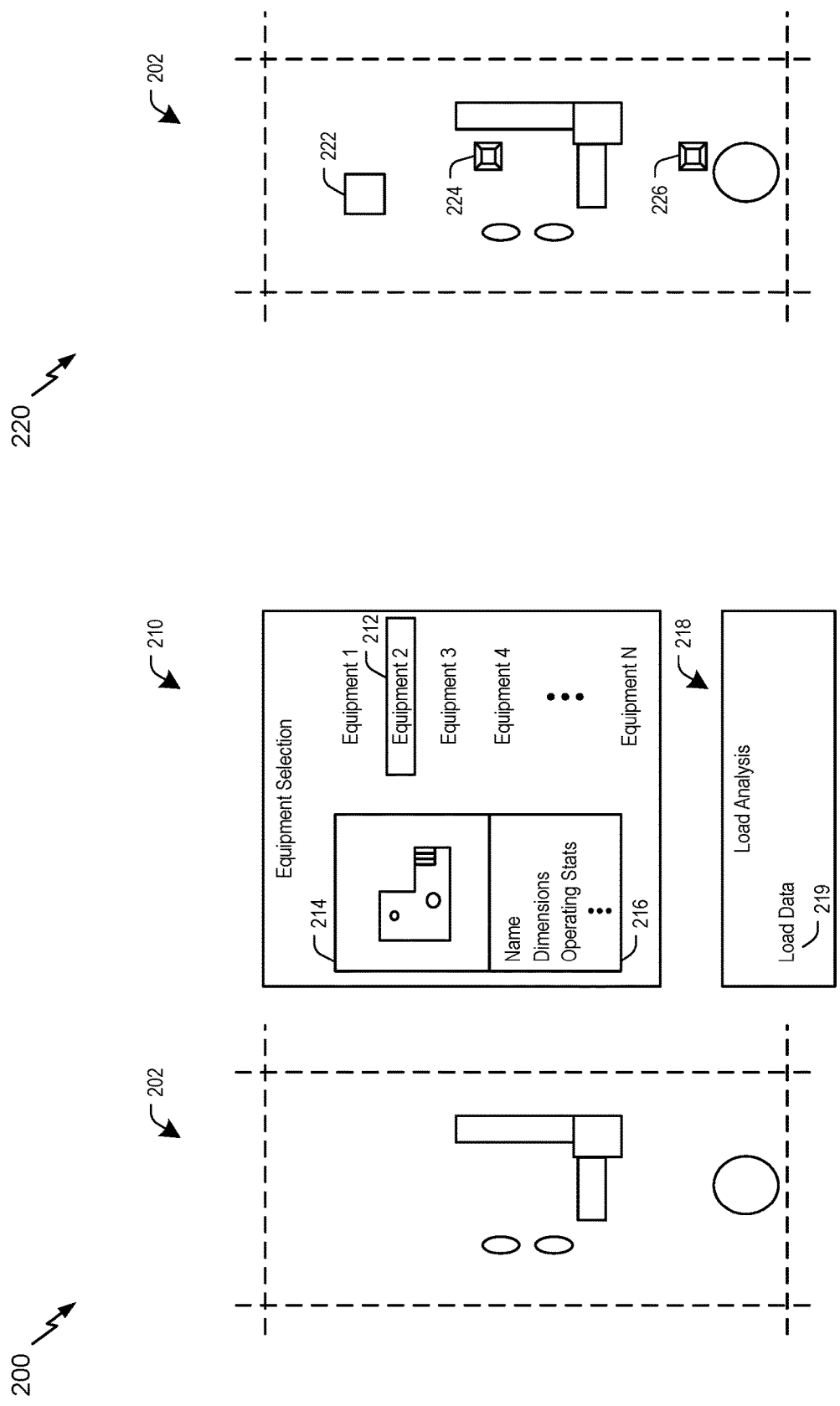

DYNAMIC GENERATION AND MODIFICATION OF A DESIGN MODEL OF A BUILDING FOR A CONSTRUCTION PROJECT

CROSS-REFERENCE TO RELATED APPLICATIONS

The present application claims the benefit of U.S. Provisional Patent Application No. 63/028,864, filed May 22, 2020, entitled "DYNAMIC DESIGN SYSTEM AND METHOD OF USE", the contents of which are incorporated by reference herein in their entirety.

TECHNICAL FIELD

The present application is generally related to the technical field of construction systems, and more particularly, but not by way of limitation, to a dynamic design system for generating and/or modifying design models of buildings or structures for construction projects.

BACKGROUND

Construction systems enable management of the process of creating buildings, structures, or items. These construction systems typically include multiple different devices, or execute multiple different pieces of software, to enable multiple different workers associated with a construction project to contribute to the building (or other structure or item) design process. To illustrate, a contractor typically receives a set of requirements for a building from a client. The set of requirements may be reviewed and optionally added to by the contractor before the set of requirements are provided to a designer (e.g., an architect). The designer uses the set of requirements to generate a design, such as a floorplan, of rooms, hallways, or other spaces within the building that are needed to comply with the set of requirements. The designer typically uses an associated device (e.g., that operations an associated software or application) to generate the design of the building. The design of the building is then passed to engineers, electricians, plumbers, and others who are tasked with specifying equipment or other items needed to comply with the set of requirements. As an example, an engineer may specify various heating, ventilation, and air conditioning (HVAC) equipment that is needed to comply with heating and cooling requirements for the building. The engineer may analyze the building design and select various HVAC equipment, as well as specify the location of such HVAC equipment within the design and routing of ducts between the HVAC equipment. As another example, an electrician or electrical engineer may specify locations and types of power outlets, as well as the routing of associated wires, within the design of the building to satisfy electrical requirements and/or electrical regulations. Because each type of equipment is associated with different criteria, regulations, design rules, goals, etc., each of the different engineers may use a different device (or a different piece of software or application) to add their respective equipment to the design of the building. After design and layout of the different types of equipment, another engineer may combine all the various equipment designs with the original building design to generate a final design that incorporates not only the rooms and spaces within the building, but also the various equipment (and associated routing) within the building. When this design is approved the actual construction of the building may begin.

One of the drawbacks commonly associated with conventional construction systems is limited efficiency. For example, the construction system typically includes multiple different devices (or execute multiple different software or applications) to enable each individual user to perform their respective design operations using their specific design skills and knowledge. Using multiple different devices, or multiple different software or applications, increases cost and complexity of the building design process. Additional manpower may also be needed to combine the designs of the different workers (e.g., the architect, the building engineer, the electrical engineer, etc.) into a single usable design. For example, another engineer or programmer may use the construction system to convert different design outputs into a common format, to add the information related to the various equipment to the floorplan, and possibly to convert the floorplan into another format, such as converting a two-dimensional (2D) floorplan to a three-dimensional (3D) model. Such conversion operations are time consuming and expensive.

Additionally, conventional construction systems are not designed to efficiently adapt to changes in designs. To illustrate, if a particular requirement is changed prior to construction, such as a requirement regarding room placement, an equipment requirement, or the like, many or all phases of the building design process have to be reevaluated. For example, a change to a room placement requirement requires a modified floorplan to comply with all of the requirements, which requires additional work by the designer (e.g., the architect). Additionally, the modified floorplan triggers modifications to the selection or placement of HVAC equipment, electrical equipment, plumbing, or other equipment, which requires additional work by various engineers or other workers, as well as additional work to combine the modified designs into a modified final design. Thus, a single modification to the design may require significant extra manpower, in some situations even nullifying some or all of the work that was previously done, which can significantly increase the cost and the duration of the building design process.

BRIEF SUMMARY

Aspects of the present disclosure provide systems, methods, and computer-readable storage media that provide techniques for dynamic generation and modification of a design model of a building, a structure, or other item, for a construction project. To illustrate, a system (e.g., a building design system) is configured to automatically generate a design model that includes a layout of rooms (or other spaces) within a building, in addition to dimensions and locations of equipment and routing of connectors between the equipment, to satisfy one or more criteria associated with the building. In some implementations, the design model may be generated based on input from multiple different users, such as architects, design engineers, electricians, plumbers, and/or other workers associated with the construction project. For example, the system may generate the design model by determining locations of one or more rooms within the building based on input an architect. As another example, the system may add virtual models of heating, ventilation, and air conditioning (HVAC) equipment, and ductwork routed between the HVAC equipment, to the design model based on input from a design engineer. As another example, the system may add virtual models of power outlets and associated wiring to the building model based on input from an electrician or an electrical engineer.

The system is configured to automatically refine or adjust the design model based on each of the various inputs, such that a final design model (e.g., a three-dimensional (3D) model of the layout of the building, equipment within the building, furniture within the building, fixtures within the building, and the like) is generated without additional user input to aggregate the respective designs of the various users or to convert the respective designs to a common format. After generation of the design model, the system may automatically modify one or more aspects or parameters of the design model based on changes in the design or requirements for the building without requiring additional user input.

In some implementations, the system may initiate a design process for the design model by receiving criteria (e.g., constraints) for the building (or the associated construction project) and layout information for the building. For example, the system may receive, via user input or from another source, one or more criteria such as building or room dimensions, neighboring room criteria, room access criteria, room connectedness criteria, a target cost, a target build time, or other criteria. The system may also enable a user (e.g., an architect or designer) to provide layout information. For example, the system may generate a graphical user interface (GUI) that enables the architect to select one or more rooms from a list of rooms, and to size and place the rooms within an editable floorplan of the building. The system may generate a two dimensional (2D) floorplan of the building based on the layout information (e.g., the editable floorplan) and the criteria. For example, the system may algorithmically determine placement of walls, doors, windows, fixtures, and the like, such that the generated floorplan satisfies the criteria and is based on the editable floorplan. The generated floorplan may be converted from a 2D floorplan to a 3D model without additional user input (e.g., without requiring the architect to use a different application, such as a 3D computer-aided drawing (CAD) application, to model the building based on the 2D floorplan). In some implementations, the system generates multiple candidate floorplans based on the criteria and the layout information, and after user selection of one of the candidate floorplans, the system generates a 3D design model of the building based on the selected candidate floorplan.

After generation of the 3D model of the layout of the rooms (or other spaces), the system may enable addition of different types of equipment to the design model (e.g., the 3D model). The equipment may include HVAC equipment, electrical equipment, plumbing equipment, or other equipment or fixtures, as non-limiting examples. For each type of equipment, the system may perform a respective load analysis (e.g., a heating and cooling load analysis, an electrical load analysis, a water load analysis, and the like) based on the design model. The system may provide the load analysis to a user (e.g., a design engineer, an electrician or electrical engineer, a plumber, etc.) in addition to multiple equipment options that may be selected for inclusion in the building. Based on an input that indicates selected equipment (e.g., a particular brand of equipment or type of equipment), the system may obtain equipment specifications for one or more pieces/components of the selected equipment. For example, the system may request equipment specifications from a vendor or access equipment specifications in a database. After obtaining the equipment specifications, the system may automatically determine dimensions and locations of the selected equipment, and may add virtual models of the selected equipment to the design model. Additionally, the system may automatically determine routing of connections (e.g., ducts, wires, pipes, or the like) between the selected equipment, and the design model may be updated to include virtual models of the connections. In some implementations, a similar process of analyzing loads, enabling user selection of equipment, automatically determining sizing and locations of the selected equipment and associated routing, and adding virtual models to the design model is performed for multiple different users, such as a design engineer, an electrical engineer, and a plumber, as non-limiting examples, to complete the design model. Upon completion of the design model, the system may display a GUI that includes a visual representation of the design model, as well as storing the design model for use during the construction project.

If any aspect of the building design is changed during or after generation of the design model, the system may automatically update the design model to incorporate the change. For example, if the criteria or the layout information is modified, such as to change dimensions of a room, the modification may be propagated automatically to one or more aspects of the design model. To illustrate, the system may update the design model to modify the dimension of the room in the 3D model. Additionally, the system may provide the modified dimension "downstream" to be used to determine whether modifications to the sizing and locations of various equipment (and the routing of associated connections) are necessary to maintain satisfaction of the criteria. These modifications may be performed automatically by the system, without requiring any additional input from the users (e.g., the architect, the design engineer, the electrical engineer, the plumber, etc.).

In this manner, the design system of the present disclosure may support dynamic generation and/or modification of a design model for a building (or other structure), which may reduce the amount of user input used to generate the design model, or to update (e.g., modify) the design model if there are changes to the building design. For example, the system may execute a set of rules (e.g., a design application) to automatically generate the design model, such as by automatically generating candidate floorplans that satisfy criteria, automatically generating a 3D model based on a selected candidate floorplan, automatically determining parameters for, and adding virtual models of, selected equipment to the design model, and automatically modifying or updating one or more aspects of the design model based on a change in the building design. Additionally, the system may execute a single design application to perform the dynamic generation and modification of the design model. Reducing the amount of user input and the number of different applications used in generating the design model may reduce the cost and the amount of time spent to design the building, which may increase efficiency and profitability of the construction project.

According to one aspect, a method for dynamic generation of a design model of a building for a construction project is described. The method includes receiving, by one or more processors, a first input that indicates one or more criteria associated with the building and layout information for the building. The method also includes generating, by the one or more processors, the design model for the building based on the one or more criteria and the layout information. The design model indicates dimensions and a layout of one or more rooms within the building. The method includes performing, by the one or more processors, a load analysis based on the design model. The method also includes receiving, by the one or more processors, a second input that indicates selected equipment based on the load analysis. The method includes updating, by the one or more processors, the design model to include locations and connections of the selected equipment within the one or more rooms. The method further includes initiating display, by the one or more processors, of a user interface (UI) that includes a visual representation of the design model.

According to another aspect, a system for dynamic generation of a design model of a building for a construction project is described. The system includes at least one memory storing instructions and one or more processors coupled to the at least one memory. The one or more processors are configured to execute the instructions to cause the one or more processors to receive a first input that indicates one or more criteria associated with the building and layout information for the building. The one or more processors are also configured to generate the design model for the building based on the one or more criteria and the layout information. The design model indicates dimensions and a layout of one or more rooms within the building. The one or more processors are configured to perform a load analysis based on the design model. The one or more processors are also configured to receive a second input that indicates selected equipment based on the load analysis. The one or more processors are configured to update the design model to include locations and connections of the selected equipment within the one or more rooms. The one or more processors are further configured to initiate display of a user interface (UI) that includes a visual representation of the design model.

According to another aspect, a computer program product is described that includes a computer-readable storage device, such as a non-transitory computer-readable storage medium, that includes instructions that, when executed by one or more processors, cause the one or more processors to perform operations for dynamic generation of a design model of a building for a construction project. The operations include executing a first routine to receive a first input that indicates one or more criteria associated with the building and layout information for the building. The operations also include executing a second routine to generate the design model for the building based on the one or more criteria and the layout information, where the design model indicates dimensions and a layout of one or more rooms within the building. The operations include executing a third routine to perform a load analysis based on the design model. The operations also include executing a fourth routine to receive a second input that indicates selected equipment based on the load analysis. The operations include executing a fifth routine to update the design model to include locations and connections of the selected equipment within the one or more rooms. The operations further include executing a sixth routine to initiate display of a user interface (UI) that includes a visual representation of the design model.

The foregoing has outlined rather broadly the features and technical advantages of the present disclosure in order that the detailed description that follows may be better understood. Additional features and advantages will be described hereinafter which form the subject of the claims of the present disclosure. It should be appreciated by those skilled in the art that the conception and specific implementations disclosed may be readily utilized as a basis for modifying or designing other structures for carrying out the same purposes of the present disclosure. It should also be realized by those skilled in the art that such equivalent constructions do not depart from the scope of the present disclosure as set forth in the appended claims. The novel features which are believed to be characteristic of the aspects of this disclosure, both as to the organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following descriptions taken in conjunction with the accompanying figures, in which:

FIGS. 2A-2D illustrate example views of a graphical user interface (GUI) configured to enable selection of equipment and automatic inclusion of the equipment in a design model of a building;

Figure 1:
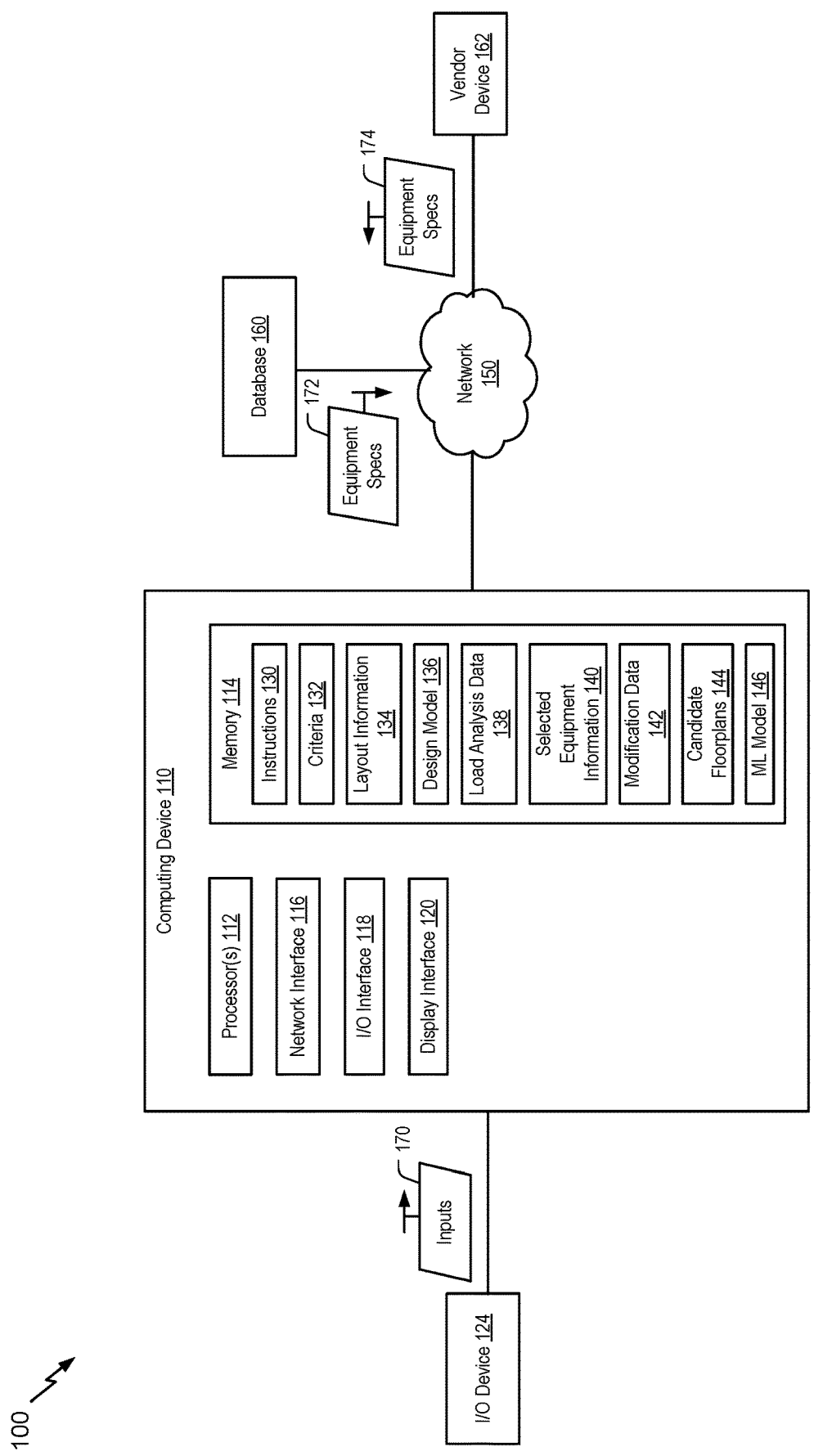
FIG. 1 is a block diagram of an example of a system that dynamically generates and modifies a design model of a building.

Although the present disclosure and its advantages have been described in detail, it should be understood that various changes, substitutions and alterations can be made herein without departing from the scope of the disclosure as defined by the appended claims. Moreover, the scope of the present application is not intended to be limited to the particular aspects of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding aspects described herein may be utilized according to the present disclosure. Accordingly, the appended claims are intended to include within their scope such processes, machines, manufacture, compositions of matter, means, methods, or steps.

DETAILED DESCRIPTION

Inventive concepts of the present disclosure utilize a system to dynamically generate and modify a design model of a building (or other structure or item) for a construction project. The design model may include a three-dimensional (3D) model of a layout of rooms (or other spaces) within the building. The design model may also include virtual models of furniture, fixtures, various types of equipment, and routing of connections between the equipment, and/or other items that are to be included within the building. The system may automatically generate the design model based on user input from one or more users (e.g., one or more employees or contractors for the construction project). For example, the system may generate a two-dimensional (2D) floorplan of the building based on criteria entered by a designer (e.g., an architect) and selection of a preliminary room layout. In some implementations, the system may generate multiple candidate floorplans that are displayed to the designer, and the designer may select a desired floorplan for automatic conversion into a 3D model. As another example, the system may perform a load analysis for a particular type of equipment based on the layout of the rooms, and the load analysis and one or more equipment options may be displayed to another user (e.g., an engineer) to enable selection of equipment to be included with in the building based on the load analysis. Based on the selected equipment, the system may automatically determine locations and dimensions of equipment, as well as location and routing of connectors between the equipment, and the system may add virtual models of the equipment (and the connections) to the design model. As a particular example, a design engineer may select a type of heating, ventilation, and air conditioning (HVAC) equipment based on a heating and cooling load analysis, and the system may automatically determine dimensions and locations of HVAC equipment, as well as routing of ducts between the HVAC equipment, and add virtual models of the HVAC equipment and ducts to the design model. As another particular example, an electrical engineer (or electrician) may select a type of electrical equipment based on an electrical load analysis, and the system may automatically determine dimensions and locations of electrical equipment, such as power outlets, as well as routing of wiring between the electrical equipment, and add virtual models of the electrical equipment to the design model. After completion of the design model, the system may display a graphical user interface (GUI) that displays a visual representation of the design model (e.g., the 3D model of the building) for use by workers of the construction project to build the building. Additionally, or alternatively, the design model may be provided to other devices to be used in the building process, such as being used to automatically order parts or equipment, as a non-limiting example. Thus, the system of the present disclosure may manage all aspects of the design process for the construction project, which may improve efficiency, reduce cost, and reduce an amount of time associated with the construction project, as compared to other design systems that leverage multiple different types of devices and/or software (e.g., applications) for various operations of the building design process.

If a change is made to an aspect of the building design during the building process, the system may automatically modify one or more aspects of the design model to account for the change without additional user input. As one example, if a room size criterion is changed, the system may automatically adjust the layout of the rooms based on the modified criterion to update the design model (e.g., by updating the layout of the rooms within the 3D model of the building). This modification may be propagated throughout the other aspects of the design model. For example, the system may perform an updated heating and cooling load analysis based on the modified layout and use the updated load analysis to determine whether to modify the characteristics, locations, and/or connections associated with any of the HVAC equipment included in the design model. Similar updates may be performed for electrical equipment, plumbing equipment, and the like. Thus, the system of the present disclosure may modify/update the design model to account for changes to the building design without requiring the various users to modify, or potentially generate entirely new, respective designs for the building. These automatic modifications performed by the system may reduce the cost and time associated with the construction project.

Certain units described in this specification have been labeled as modules in order to more particularly emphasize their implementation independence. A module is "[a] self-contained hardware or software component that interacts with a larger system." Alan Freedman, "The Computer Glossary" 268 (8th ed. 1998). A module may comprise a machine- or machines-executable instructions. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also include software-defined units or instructions, that when executed by a processing machine or device, transform data stored on a data storage device from a first state to a second state. An identified module of executable code may, for instance, comprise one or more physical or logical blocks of computer instructions that may be organized as an object, procedure, or function. Nevertheless, the executables of an identified module need not be physically located together, but may comprise disparate instructions stored in different locations that, when joined logically together, comprise the module, and when executed by the processor, achieve the stated data transformation. A module of executable code may be a single instruction, or many instructions, and may even be distributed over several different code segments, among different programs, and/or across several memory devices. Similarly, operational data may be identified and illustrated herein within modules, and may be embodied in any suitable form and organized within any suitable type of data structure. The operational data may be collected as a single data set, or may be distributed over different locations including over different storage devices.

In the following description, numerous specific details are provided, such as examples of programming, software modules, user selections, network transactions, database queries, database structures, hardware modules, hardware circuits, hardware chips, etc., to provide a thorough understanding of the present aspects. One skilled in the relevant art will recognize, however, that aspects of the disclosure may be practiced without one or more of the specific details, or with other methods, components, materials, and so forth. In other instances, well-known structures, materials, or operations are not shown or described in detail to avoid obscuring aspects of the disclosure.

As used herein, various terminology is for the purpose of describing particular implementations only and is not intended to be limiting of implementations. For example, as used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). The term "coupled" is defined as connected, although not necessarily directly, and not necessarily mechanically; two items that are "coupled" may be unitary with each other. The terms "a" and "an" are defined as one or more unless this disclosure explicitly requires otherwise. The term "substantially" is defined as largely but not necessarily wholly what is specified (and includes what is specified; e.g., substantially 90 degrees includes 90 degrees and substantially parallel includes parallel), as understood by a person of ordinary skill in the art. In any disclosed aspect, the term "substantially" may be substituted with "within [a percentage] of" what is specified, where the percentage includes 0.1, 1, or 5 percent; and the term "approximately" may be substituted with "within 10 percent of" what is specified. The phrase "and/or" means and or. To illustrate, A, B, and/or C includes: A alone, B alone, C alone, a combination of A and B, a combination of A and C, a combination of B and C, or a combination of A, B, and C. In other words, "and/or" operates as an inclusive or. Similarly, the phrase "A, B, C, or a combination thereof" or "A, B, C, or any combination thereof" includes A alone, B alone, C alone, a combination of A and B, a combination of A and C, a combination of B and C, or a combination of A, B, and C.

The terms "comprise" (and any form of comprise, such as "comprises" and "comprising"), "have" (and any form of have, such as "has" and "having"), and "include" (and any form of include, such as "includes" and "including"). As a result, an apparatus that "comprises," "has," or "includes" one or more elements possesses those one or more elements, but is not limited to possessing only those one or more elements. Likewise, a method that "comprises," "has," or "includes" one or more steps possesses those one or more steps, but is not limited to possessing only those one or more steps.

Any implementations of any of the systems, methods, and article of manufacture can consist of or consist essentially of—rather than comprise/have/include—any of the described steps, elements, and/or features. Thus, in any of the claims, the term "consisting of" or "consisting essentially of" can be substituted for any of the open-ended linking verbs recited above, in order to change the scope of a given claim from what it would otherwise be using the open-ended linking verb. Additionally, the term "wherein" may be used interchangeably with "where."

Further, a device or system that is configured in a certain way is configured in at least that way, but it can also be configured in other ways than those specifically described. The feature or features of one implementation may be applied to other implementations, even though not described or illustrated, unless expressly prohibited by this disclosure or the nature of the implementations.

Referring to FIG. 1, a block diagram of an example of a system that dynamically generates and modifies a design model of a building according to one or more aspects is shown and designated 100. System 100 includes a computing device 110, an input/output (I/O) device 124, one or more networks 150, a database 160, and a vendor device 162. Computing device 110 may include or correspond to a personal computing device, a laptop computing device, a tablet computing device, a smartphone, a mobile phone, a cellular phone, a satellite phone, a personal digital assistant (PDA), a smart watch or other "wearable" device, a computer system of a vehicle, another type of wireless computing device, a desktop computer, an entertainment system, a server, a network computing device, an augmented reality (AR) device, a virtual reality (VR) device, an extended reality (XR) device, or any part thereof. Although shown as a single computing device 110, in some other implementations, system 100 may include multiple computing devices 110 which may include or correspond to the same or different types of computing devices. In some such implementations, computing device 110 can comprise a server and/or cloud-based computing platform configured to perform operations and/or execute the operations described herein. Accordingly, computing device 110 (e.g., a server) may include a particular purpose computing system designed, configured, or adapted to perform and/or initiate operations, functions, processes, and/or methods described herein and can be communicatively coupled with a number of end user devices, which can be, e.g., a computer, tablet, smartphone, wearable device, or other similar end user computing device. To further illustrate, the server may support a design model application that is configured to generate and modify a design model of a building based on input from one or more user, such as a designer, an architect, a design engineer, an electrical engineer, an electrician, a plumber, and the like, via respective end user devices that execute user device versions of the design application. In such implementations, users can interact with the server using a device via one or more networks, such as network 150, which itself can comprise one or more of a local intranet, a Local Area Network (LAN), a Wide Area Network (WAN), a virtual private network (VPN), and the like, and/or via point-to-point or peer-to-peer (P2P) communications between multiple end user devices. Alternatively, computing device 110 may be a single computing device that executes the design application and that is shared between one or more users. Thus, the operations described herein with reference to computing device 110 may be performed by multiple devices (e.g., a server and one or more end user devices) or a single computing device that execute a single design application (e.g., a set of instructions).

Computing device 110 includes one or more processors 112, a memory 114, a network interface 116, an input/output (I/O) interface 118, and a display interface 120. One or more processors 112 may include one or more microcontrollers, application specific integrated circuits (ASICs), field programmable gate arrays (FPGAs), central processing units (CPUs) having one or more processing cores, graphical processing units (GPUs), or other circuitry and logic configured to facilitate the operations of computing device 110 in accordance with aspects of the present disclosure. Memory 114 may include random access memory (RAM) devices, read only memory (ROM) devices, erasable programmable ROM (EPROM), electrically erasable programmable ROM (EEPROM), one or more hard disk drives (HDDs), one or more solid state drives (SSDs), flash memory devices, network accessible storage (NAS) devices, or other memory devices configured to store data in a persistent or non-persistent state. Software configured to facilitate operations and functionality of computing device 110 may be stored in memory 114 as instructions 130 (e.g., an application) that, when executed by one or more processors 112, cause one or more processors 112 to perform the operations described herein with respect to computing device 110, as described in more detail below. Additionally, memory 114 may be configured to store criteria 132, layout information 134, design model 136, load analysis data 138, selected equipment information 140, modification data 142, candidate floorplans 144, and a machine learning (ML) model 146. Exemplary aspects of criteria 132, layout information 134, design model 136, load analysis data 138, selected equipment information 140, modification data 142, candidate floorplans 144, and ML model 146 are described in more detail below.

Network interface 116 may be configured to communicatively couple computing device 110 to one or more networks 150 via wired or wireless communication links established according to one or more communication protocols or standards (e.g., an Ethernet protocol, a transmission control protocol/internet protocol (TCP/IP), an Institute of Electrical and Electronics Engineers (IEEE) 802.11 protocol, an IEEE 802.16 protocol, a 3rd Generation (3G) communication standard, a 4th Generation (4G)/long term evolution (LTE) communication standard, a 5th Generation (5G) communication standard, and the like). For example, network interface 116 may include a transmitter, a receiver, or a combination thereof (e.g., a transceiver). I/O interface 118 may couple computing device 110 to I/O device 124 that includes one or more display devices, a keyboard, a stylus, one or more touchscreens, a mouse, a trackpad, one or more microphones, one or more cameras, one or more speakers, haptic feedback devices, or other types of devices that enable a user to receive information from or provide information to computing device 110. Although shown in FIG. 1 as being external to computing device 110, in some other implementations, I/O device 124 may be included or integrated within computing device 110. Additionally, or alternatively, I/O interface 118 may couple computing device 110 to one or more storage devices, such as one or more of a hard drive, a solid state storage device, a flash drive, a compact disc (CD) drive, a floppy disk drive, a tape drive, and/or the like. Display interface 120 may be driven by one or more processors 112 to control presentation via a display device, such as a monitor, a liquid crystal display (LCD) screen, a touch screen, or other types of display devices.

The concepts described herein are not limited to the architecture of computing device 110. Rather, computing device 110 is provided as an example of one type of computing device that can be adapted to perform the functions of computing device 110. For example, any suitable processor-based device can be utilized including, without limitation, PDAs, tablet computers, smartphones, wearable devices, multi-processor servers, and the like. Moreover, the systems and methods of the present disclosure can be implemented on ASICs, FPGAs, very large scale integrated (VLSI) circuits, or other circuitry. In fact, persons of ordinary skill in the art may utilize any number of suitable structures capable of executing logical operations according to the described aspects. Additionally, it should be appreciated that computing device 110, or certain components thereof, may reside at, or be installed in, different locations within system 100.

One or more networks 150, such as a communication network, may facilitate communication of data between computing device 110 and other components, servers/processors, and/or devices. For example, one or more networks 150 may also facilitate communication of data between computing device 110 and database 160, vendor device 162, or any combination therefore. One or more networks 150 may include a wired network, a wireless network, or a combination thereof. For example, one or more networks 150 may include any type of communications network, such as a direct PC-to-PC connection, a local area network (LAN), a wide area network (WAN), a modem-to-modem connection, the Internet, intranet, extranet, cable transmission system, cellular communication network, any combination of the above, or any other communications network now known or later developed within which permits two or more electronic devices to communicate.

Database 160 includes one or more databases (or other data sources) that are configured to store data that is accessible to computing device 110. In some implementations, database 160 may be configured to store equipment specifications for a plurality of equipment (or equipment models, equipment types, or vendors/brands) that may be added to a building during design of the building, as further described below. Vendor device 162 includes a computing device, such as a personal or desktop computer, a tablet computing device, a mobile computing device, a server, that is operated by an equipment vendor. Vendor device 162 may include one or more processors, a memory, an I/O interface, and a network interface, similar to computing device 110, to enable vendor device 162 to perform the operations described herein. In some implementations, vendor device 162 may be configured to receive a request from computing device 110 and to provide equipment specifications to computing device 110 based on the request. Although one representative vendor device is shown in FIG. 1, system 100 may include more than one vendor device (e.g., one or more devices corresponding to each of one or more equipment vendors).

During operation of the system 100, one or more processors 112 may execute a design application (e.g., instructions 130) to enable design model generation for use as part of a construction project to build a building. Although described herein with reference to a building, in other implementations, the design application may be executed to enable design model generation for any type of structure or item that is built during a construction project, such as by a building contractor or other similar entity. In some implementations, executing the design application may include executing a plurality of rules to perform one or more aspects of the design model generation, such as generating multiple candidate floorplans, determining locations and properties of selected equipment, or updating the design model, as further described herein. Execution of the design application may cause computing device 110 to initiate display of one or more graphical user interfaces (GUIs) that include partial and/or complete versions of design models, selectable or configurable interfaces to enable selection or modification of one or more aspects of the design models, information associated with aspects of the design models, such as layout information, equipment information, and the like, and one or more prompts to request user input to select options or enter information used to generate the design models. For example, a user may interact with I/O device 124 to enter information, select options, and/or otherwise interact with computing device 110 during the design process, and I/O device 124 may provide inputs 170 that are indicative of the user inputs to computing device 110 for use in the design process.

In some implementations, execution of the design application by computing device 110 (e.g., the design process) to design a building may include performance of multiple phases, such as model creation, load calculation, and system design, that result in a final design. The model creation, load calculation, and system design may be performed substantially sequentially, such that outputs (or later modifications/changes) of each phase would automatically "flow" to the next phase. For example, data management tools may be used to store and transition data from one phase to the next. Each of the phases may include one or more operations. For example, the model creation may include creating design views, creating space data objects that are representative of rooms within the building, and populating the space data objects with design requirements. As another example, the load calculation may include extracting space properties, analyzing the spaces for various needs/supported loads (e.g., heating and cooling loads, electrical loads, water loads, and the like), and storing the results with the spaces. As another example, the system design may include placing virtual models (which may be referred to as "smart families") of equipment within the rooms, creating connectors (e.g., duct lines, wires, pipes, and the like) that represent flow paths between the virtual models, and sizing the corresponding equipment based on the virtual models. The phases are described in further detail below.

To enable design of a building, computing device 110 may receive one or more criteria 132 and/or layout information 134. For example, computing device 110 may receive a first input (e.g., one or more of inputs 170) from I/O device 124, the first input indicating criteria 132 associated with the building and layout information 134 for the building. In some implementations, criteria 132 may include dimensions of a room, one or more required room types, one or more pathway criteria, one or more room access criteria, one or more building access criteria, one or more window criteria, one or more furniture criteria, other criteria, or a combination thereof. For example, a room dimensions criterion may indicate that each room must be no more than 400 square feet ($ft^2$) in area. As another example, a required room type criterion may indicate that the building must include at least one bedroom. As another example, a pathway criterion may indicate that each room may be connect to at most two hallways. As another example, a room access criterion may indicate that a particular room may only be accessed via a door to an adjacent room (e.g., not via a door to a hallway). As another example, a building access criterion may indicate that there must be at least four building accesses (e.g., doors or windows) on the ground floor. As another example, a window criterion may indicate that no bedroom may have a window that faces west. As another example, a furniture criterion may indicate that each classroom must include at least one desk and at least two rows of chairs. The criteria 132 may be provided by one or more users of computing device 110, such as a designer (e.g., an architect) associated with the construction project, via I/O device 124. In some implementations, criteria 132 may be based on one or more requirements from a client for which the construction project is being performed, one or more targets or desired outcomes from a contractor of the construction project (e.g., based on parameters of previous successful construction projects and/or skills and knowledge of the contractor), one or more criteria determined by the designer (e.g., based on skills and knowledge and/or previous building design experience of the designer), other information, or a combination thereof.

Layout information 134 may indicate a preliminary layout and sizes of one or more rooms (or other spaces) within the building. Layout information 134 may be provided in varying levels of detail. For example, layout information 134 may indicate relative positions of one or more rooms, such as that a kitchen is to be located adjacent to a dining room, or that a bathroom is to be located adjacent to a bedroom. As another example, layout information 134 may indicate that a laboratory is to be located to the south of a classroom, to the east of a storage room, and to the north of a main hallway, and that the laboratory is to be located on the first floor below a location of a cafeteria on a second floor. As another example, layout information 134 may include data indicative of a preliminary layout (e.g., placement) of one or more rooms via an interactive GUI, as described in further detail below. In addition to indicating location of the room(s), layout information 134 may indicate sizing of one or more rooms. For example, layout information 134 may indicate a length, a width, a height, an area, or any other dimension(s) of one or more rooms. In addition to indicating layout and sizing of rooms, if the building is more than one story, layout information 134 may indicate location, orientation, and/or dimensions of one or more stairways or other means of traveling between floors of the building (e.g., an elevator, as a non-limiting example).

After receiving criteria 132 and layout information 134, computing device 110 may generate a design model 136 for the building based on criteria 132 and layout information 134. Design model 136 may indicate dimensions and a layout of one or more rooms (or other spaces) within the building, in addition to other information associated with the building, or the contents thereof. In some implementations, design model 136 includes a three-dimensional (3D) model of the building. In addition to visually representing the rooms (or other spaces) within the building, design model 136 may include information associated with rooms, zones, or other areas or elements within the building. For example, design model 136 may include dimensions of the rooms, building materials for constructing various elements of the building (e.g., walls, floors, doors, windows, etc.), budgets associated with the construction project, timelines associated with the construction project, or other information. After additional input, the 3D model may include virtual models corresponding to the equipment located within the building, furniture located within the one or more rooms, fixtures located within the one or more rooms, one or more air ducts routed within the building, wiring routed within the building, pipes routed within the building, other items located within the building, or a combination thereof. In some other implementations, design model 136 may include other types of models, such as a two-dimensional (2D) model (e.g., a floorplan), a VR model, an AR model, an XR model, or the like.

In some implementations, to generate design model 136, computing device 110 may display an interactive GUI that enables a user to design a preliminary floorplan (e.g., 2D model), and computing device 110 may automatically generate multiple candidate floorplans 144 (e.g., 2D models) based on the user-designed floorplan (e.g., corresponding to layout information 134) and criteria 132. Upon selection of a candidate floorplan by the user, computing device 110 may automatically generate a 3D model based on the selected candidate floorplan (e.g., computing device 110 may convert the 2D candidate floorplan to a 3D model corresponding to design model 136). To illustrate, computing device 110 may display (e.g., via a display device coupled to or included within computing device 110) an interactive GUI that includes an editable floorplan of the building. The interactive GUI may also include one or more selectable shapes corresponding to rooms for inclusion in the editable floorplan, and optionally, additional editing tools. The designer (e.g., the architect) may select a shape corresponding to a particular room and place the shape at a desired location within the editable floorplan. The selected shape may be modified, such as by extending or contracting one or more borders, to size the corresponding room. In this manner, the designer may create a preliminary floorplan (e.g., a floorplan that does not satisfy criteria 132), as further described herein with reference to FIGS. 3A-D. If the building includes multiple floors, a preliminary floorplan for each floor may be created by the designer. Data that indicates the preliminary floorplan may be stored as layout information 134.

After receiving (or generating) criteria 132 and layout information 134, computing device 110 may generate candidate floorplans 144 based on criteria 132 and layout information 134 (e.g., the selected shapes and their associated locations and sizes). Computing device 110 may generate each candidate floorplan of candidate floorplans 144 such that the candidate floorplan satisfies criteria 132. To illustrate, computing device 110 may modify one or more parameters of the user-generated floorplan, such as locations of one or more rooms and/or dimensions of one or more of the rooms, to generate a candidate floorplan that satisfies criteria 132. As non-limiting examples, computing device 110 may modify the user-generated floorplan by placing a kitchen nearer to a dining room based on a criterion indicating that kitchens are only accessible through dining rooms (e.g., and not through hallways), or computing device 110 may increase a length of a bedroom to enable placement of a window along a length-wise wall and decrease a width of the bedroom based on a criterion indicating that each bedroom must include at least one window and a criterion indicating that an area of a bedroom does not exceed an area threshold. In some implementations, computing device 110 may execute a plurality of predefined rules associated with generating or modifying floorplans to satisfy criteria 132. In addition, or alternatively, to modifying one or more parameters of the user-generated floorplan, computing device 110 may add additional elements to the user-generated floorplan to generate a candidate floorplan that satisfies criteria 132. The additional elements may include one or more additional rooms, one or more hallways connected to one or more rooms, exterior doors, interior doors (e.g., doors between rooms or between rooms and hallways), windows, furniture, fixtures, other objects, or a combination thereof. As an example, computing device 110 may add a pantry within a kitchen in the candidate floorplan based on a criterion indicating that kitchens are located within a threshold distance of a pantry. As another example, computing device 110 may a hallway between a living room and a bedroom based on a room access criterion. As another example, computing device 110 may add at least one desk and at least two rows of chairs to a classroom based on a furniture criterion for classrooms. As another example, computing device 110 may add a chandelier to an entrance room based on a lighting criterion. The above-described examples are not intended to be limiting, and other additions to design model 136 to comply with any type of building criteria are also contemplated and are within the scope of this disclosure.

In some implementations, computing device 110 generates multiple candidate floorplans (e.g., candidate floorplans 144 may include multiple candidate floorplans). For example, multiple different room layouts, room dimensions, hallway layouts, furniture layouts, and the like, may satisfy criteria 132, and computing device 110 may generate multiple different candidate floorplans for review by the user (e.g., the designer). After generation of candidate floorplans 144, computing device 110 may display at least some of candidate floorplans 144 to enable user selection, as further described with reference to FIG. 4. In some implementations, computing device 110 may display a preconfigured number of highest ranked floorplans of candidate floorplans 144. Candidate floorplans 144 may be ranked based on previously selected or generated floorplans, historical building design data, and/or the like. Each candidate floorplan of candidate floorplans 144 may indicate a respective layout of one or more rooms corresponding to one or more selected shapes (e.g., via the interactive GUI), respective dimensions of the one or more rooms, layout of hallways to connect the one or more rooms, locations of one or more doors for the one or more rooms, other layout information, or a combination thereof. In some implementations, candidate floorplans 144 may be displayed in a thumbnail format, or other preconfigured size, orientation, magnification, or the like, and selection of a particular thumbnail may enable rotation, magnification, or other display options associated with a particular candidate floorplan. Additionally, or alternatively, various elements of candidate floorplans may be color-coded, labeled with text, or otherwise visually represented to enable quick apprehension by the designer (or other user). For example, each room type may be displayed with a corresponding color outline, hallways and other non-room spaces may be displayed with different hatching or patterns than rooms, different types of furniture may be represented by different shaped icons, exterior doors may be represented using wider lines than interior doors, and the like, as non-limiting examples.

The designer (or other user) may select one of the displayed candidate floorplans for use in generating design model 136. For example, computing device 110 may receive an input (e.g., one of inputs 170) responsive to display of candidate floorplans 144. If the input indicates selection of one of candidate floorplans 144, computing device 110 may generate a 3D model of the building (e.g., design model 136) based on the selected candidate floorplan. For example, computing device 110 may generate a 3D model that includes 3D representations of walls, doors, windows, furniture, fixtures, and/or other objects included in the selected candidate floorplan. Design model 136 (e.g., the 3D model of the building) may be generated automatically (e.g., without additional user input, such as without input to a 3D computer-aided drawing (CAD) application). Alternatively, if the input indicates rejection of candidate floorplans 144, computing device 110 may generate additional candidate floorplans based on criteria 132 and layout information 134 (e.g., the selected shapes and associated locations and sizes from the user-generated floorplan), and computing device 110 may display the additional candidate floorplans for user selection. Additional candidate floorplans may be generated and displayed in this manner until user selection of a candidate floorplan to generate design model 136. Details of the 3D model are further described herein with reference to FIG. 5.

After generating design model 136 (e.g., after completing the model creation phase), computing device 110 may perform a load analysis based on design model 136. The load analysis corresponds to a type of equipment to be included in the building, and indicates an estimated load associated with the building design (e.g., by the location of the rooms, the furniture, fixtures, or other objects included within the rooms, and/or other aspects of design model 136) and/or criteria 132. For example, computing device 110 may perform a heating and cooling load analysis based on design model 136 and/or criteria 132 (e.g., estimate a heating and cooling load associated with design of the building). As another example, computing device 110 may perform an electrical load analysis based on design model 136 and/or criteria 132 (e.g., estimate an electrical load associated with design of the building). As another example, computing device 110 may perform a water load analysis based on design model 136 and/or criteria 132 (e.g., estimate a water load associated with design of the building). Performance of the load analysis generates load analysis data 138. In some implementations, the load analysis may be performed using publicly available or third-party load analysis software, such as DOE-2, EnergyPlus™, DAYSIM, or Radiance, as non-limiting examples.

The load analysis may determine a balance for a particular equipment system that prevents (or reduces the likelihood) that the equipment system is overloaded. The load analysis may also indicate potential improvements to safety and/or efficiency that can be achieved by particular distribution of equipment. The load analysis may be performed based on predetermined equipment corresponding to the type of load analysis (e.g., predetermined electrical equipment for an electrical load analysis, predetermined HVAC equipment for a heating and cooling analysis, etc.), information associated with the building design, information associated with the expected use of the building, other information, or a combination thereof. For example, if the load analysis is a heating and cooling analysis, the load analysis may be based on spatial geometry of the rooms, materials associated with the building, a number and locations of windows included in the building, exhaust rates and/or infiltration rates associated with the building, the expected number of people that will occupy the building, or a combination thereof, as non-limiting examples. In some implementations, in addition to performing the load analysis, computing device 110 may perform other types of analysis, such as automated energy modelling and/or automated life-cycle cost analysis, as non-limiting examples.

After performing a particular load analysis, computing device 110 may display, via a GUI, one or more selectable equipment options and results of the load analysis (e.g., load analysis data 138) to enable user selection of equipment to be added to the building design. The equipment may include HVAC equipment, electrical equipment, plumbing equipment, telecommunication equipment, or another type of equipment, that corresponds to the type of load analysis performed by computing device 110. In some implementations, the selectable equipment options include one or more categories of equipment, one or more vendors (e.g., one or more brands of equipment), one or more models or families of equipment, one or more particular pieces of equipment, or a combination thereof. For example, if computing device 110 performs a heating and cooling load analysis, the GUI may include selectable options for multiple different vendors of HVAC equipment and/or for multiple different models of HVAC equipment from one or more vendors. A user (e.g., a design engineer, an electrical engineer, an electrician, a plumber, or the like) may select equipment that satisfies the load analysis, such as by selecting one of the displayed equipment options using I/O device 124. Computing device 110 may receive an input (e.g., one or more of inputs 170) from I/O device 124 that includes selected equipment information 140 (e.g., that indicates selected equipment by the design engineer or other user).

After receiving the indication of the selected equipment, computing device 110 may obtain equipment specifications (e.g., data sheets, dimensions, operating characteristics, prices, and/or other information) corresponding to the selected equipment. In some implementations, the equipment specifications may be obtained from database 160. To illustrate, database 160 may store data indicating equipment specifications for multiple different equipment (e.g., multiple different equipment types, vendors, models, units, etc.), and computing device 110 may access database 160 based on selected equipment information 140 and load analysis data 138 to retrieve equipment specifications 172. For example, selected equipment information 140 may indicate a particular vendor, and computing device 110 may determine particular model(s) of equipment from the particular vendor that satisfy the results of the load analysis for retrieval of equipment specifications 172. As another example, selected equipment information 140 may indicate a particular component of equipment, and computing device 110 may retrieve equipment specifications 172 associated with the particular component. Database 160 may store equipment specifications obtained through online research (e.g., web-crawling), previous construction projects, or directly from vendors. For example, an entity that maintains database 160 may contract with one or more vendors to store equipment specifications and provide equipment specifications to contractors. Because multiple equipment specifications are stored in database 160, equipment specifications 172 may be retrieved by computing device 110 in real-time/substantially real-time (e.g., accounting for processing needs of the various aspects being utilized).

In some other implementations, computing device 110 may request equipment specifications from vendor device 162 based on selected equipment information 140 and load analysis data 138. To illustrate, vendor device 162 may store (or have access to) equipment specifications for multiple equipment sold by a corresponding vendor, and if selected equipment information 140 indicates the vendor, computing device 110 may communicate with vendor device 162. For example, computing device 110 may transmit selected equipment information 140 (e.g., an indication of the selected equipment) to vendor device 162, and vendor device 162 may provide equipment specifications 174 to computing device 110. Computing device 110 may be configured to communicate with vendor device 162, such as via interacting with an application programming interface (API) supported by vendor device 162, to receive equipment specifications 174 faster than if the design engineer contacts a representative of the vendor, such as by phone or e-mail, to request equipment specifications 174. In some implementations, equipment specifications 174 may be received in real-time/substantially real-time (e.g., accounting for processing needs of the various aspects being utilized and time associated with communicating between computing device 110 and vendor device 162). In some other implementations, vendor device 162 may require user input prior to providing equipment specifications 174. In some implementations, equipment specifications 174 may be stored in database 160 for retrieval during future building design processes, which may be faster than requesting equipment specifications 174 from vendor device 162.

After receipt of equipment specifications 172 or equipment specifications 174, and incorporation of the respective equipment specifications into selected equipment information 140, computing device 110 may update design model 136 to include locations and connections of the selected equipment within one or more rooms. Updating design model 136 in this manner may include adding virtual models of the selected equipment to one or more locations within one or more rooms in design model 136 based on load analysis data 138 and selected equipment information 140 (e.g., the equipment specifications). The virtual models may have dimensions that correspond to dimensions of the physical equipment to be included in the building, and the virtual models may be located within the design model 136 at locations corresponding to where the physical equipment is to be installed and/or located within the building. To illustrate, computing device 110 may determine one or more properties of the selected equipment, such as the dimensions of the selected equipment, based on selected equipment information 140 (e.g., the equipment specifications). Computing device 110 may identify operating characteristics of the selected equipment based on the equipment specifications, and computing device 110 may determine a quantity and/or locations for the selected equipment based on the operating characteristics and load analysis data 138. For example, based on load analysis data 138 indicating that a living room requires up to a particular amount of cooling and that a basement is centrally-located (e.g., is within a particular distance) with respect to other rooms associated with cooling or heating requirements, computing device 110 may determine that an air conditioning unit is to be located within the basement. The location of the selected equipment may be further based on criteria 132, which may include equipment location criteria and/or regulations (e.g., laws, building codes, home owner association (HOA) policies, and the like) associated with particular types of equipment and/or the building. The dimensions of the air conditioning unit (e.g., the selected equipment) may be determined based on the equipment specifications (e.g., selected equipment information 140). In some implementations, computing device 110 may execute a plurality of rules associated with sizing and positioning equipment based on equipment specifications to determine the locations and/or the properties (e.g., dimensions) of the selected equipment.

Responsive to determining the location and the dimensions for the selected equipment, computing device 110 may add a virtual model of the selected equipment to design model 136. The virtual model may be located at the determined location within design model 136 (e.g., within the 3D model of the building), and dimensions of the virtual model may correspond to the dimensions of the physical equipment to be included within the building. Inclusion of some equipment in design model 136 may trigger inclusion of other related equipment. As a non-limiting example, addition of a shower to design model 136 may trigger addition of a water heater if one is not already included in design model 136. A determination to include related equipment may be based on selected equipment information 140, such that equipment specifications for a particular piece of equipment (e.g., a shower) are linked to one or more other required pieces of equipment (e.g., a water heater).

In some implementations, updating design model 136 also includes adding connections between the selected equipment to the building design. As referred to herein, "connections" between equipment refers to one or more components, fixtures, etc., that couple one piece of equipment to another piece of equipment. The type of connections are based on the type of equipment being connected. For example, HVAC equipment may be connected by ducts (e.g., air ducts), ventilation shafts, and the like, electrical equipment may be connected via wires or wiring, plumbing equipment may be connected by pipes, and other types of equipment may be connected by other types of connections. Updating the building design to include connections between the selected equipment may include adding virtual models of the connections to one or more locations within one or more rooms (or other areas) in design model 136 based on load analysis data 138 and the equipment included in design model 136. To illustrate, if the equipment is HVAC equipment, selected equipment information 140 may indicate information associated with ducts for connecting the HVAC equipment, such as sizing or other properties of the ducts, criteria associated with connecting the HVAC equipment, routing criteria for the ducts, and the like. Computing device 110 may determine properties of the connections, such as dimensions, connection types, interfaces with equipment, and the like, and locations of the connections based on selected equipment information 140 and the locations of the selected equipment within design model 136. Computing device 110 may determine quantity and/or locations for the connections between the selected equipment based on the locations of the selected equipment and load analysis data 138. For example, based on load analysis data 138 indicating that the living room requires up to a particular amount of cooling, computing device 110 may determine that at least two air ducts are to connect the living room to an air conditioning unit located within the basement.

Responsive to determining the location and the dimensions for connections between the selected equipment, computing device 110 may add virtual models corresponding to the connections to design model 136. For example, virtual models of air ducts, wires, pipes, or other connectors may be added to design model 136. The virtual models may be located at the determined locations within design model 136 (e.g., within the 3D model of the building), and routing of the connections (e.g., behind walls, beneath floors, above ceilings, etc.) may be based on routing information or criteria included in selected equipment information 140. The connections points between the selected equipment and the connections may also be automatically determined, such as based on the equipment specifications, such that the selected equipment is interconnected based on manufacturer-specific and/or model-specific data. In some implementations, the virtual models of the connections may appear at least partially transparent in design model 136, due to being located behind a wall, floor, or ceiling. Additionally, or alternatively, the virtual models of the connections between equipment and the virtual models of the equipment may have the same color. Adding virtual models of equipment and associated connections is further described herein with reference to FIGS. 2A-D.

In some implementations, computing device 110 may automatically determine the properties and locations of the selected equipment and the associated connections, and automatically add the virtual models to design model 136. For example, computing device 110 may determine properties and locations of the selected equipment and associated connections based on selected equipment information 140 and optionally other information, such as criteria 132, without receiving user input after selection of the equipment. Thus, computing device 110 may enable fast and scalable design/layout of equipment within the building without requiring an engineer (or other user) to manually read equipment specifications or manufacturers' catalogs, or manually determine the dimensions, locations, and/or connections of the selected equipment. In some other implementations, computing device 110 may enable selection of one or more aspects of the equipment design process. As a non-limiting example, computing device 110 may determine multiple candidate locations for the selected equipment and display the multiple candidate locations via the GUI to enable user selection of the location of the selected equipment.

In some implementations, computing device 110 may determine the locations, properties, and/or routing of the selected equipment and associated connections using ML model 146. ML model 146 may be configured to receive input data that indicates load analysis data 138, selected equipment information 140, portions thereof, or a combination thereof, and to output locations of the selected equipment, properties (e.g., dimensions) of the equipment, or a combination thereof. Additionally, or alternatively, ML model 146 may be configured to receive input data that indicates the dimensions and the locations of the selected equipment and selected equipment information 140, and to output locations of connections between the selected equipment, routings of the connections between the selected equipment, other properties of the connections between the selected equipment, or a combination thereof. ML model 146 may include a single ML model or multiple ML models configured to perform the operations described herein using supervised learning, unsupervised learning, or semi-supervised learning techniques. ML model 146 may include any type of ML model or logic capable of being trained to output locations, properties, routing, or a combination thereof of selected equipment and associated connections based on training data, such as neural networks (NNs), support vector machines (SVMs), decision trees, random forests, regression models, Bayesian networks (BNs), dynamic Bayesian networks (DBNs), Gaussian processes, hidden Markov models (HMMs), and the like. ML model 146 may be trained using training data that is based on equipment placement in historical building designs, connection placement and routing in historical building designs, equipment specifications, equipment-related regulations, other information, or a combination thereof. The training data may be labelled based on the building type (or any other discriminator) to train ML model 146 to determine different locations and/or other information for different types of buildings. In some implementations, computing device 110 may be configured for use by a particular contractor or for designing a particular type of building, and the training data for ML model 146 may be based on historical building data associated with the particular contractor or the particular building type.

In some implementations, after adding virtual models for one type of equipment, computing device 110 may repeat the load analysis, equipment selection, and virtual model addition operations for one or more other types of equipment. To illustrate, computing device 110 may perform the above-described operations to determine a heating and cooling load associated with design model 136, enable a design engineer (or other user) to select HVAC equipment based on the heating and cooling load analysis, and add virtual models of HVAC equipment and air ducts to design model 136. Computing device 110 may also perform the above-described operations to determine an electrical load associated with design model 136, enable an electrical engineer (or other user) to select electrical equipment based on the electrical load analysis, and add virtual models of electrical equipment and wiring to design model 136. Computing device 110 may also perform the above-described operations to determine a water load associated with design model 136, enable a plumber (or other user) to select plumbing equipment based on the water load analysis, and add virtual models of plumbing equipment and pipes to design model 136. In some implementations, computing device 110 may perform operations associated with the different types of equipment in series, such as based on a predetermined order. In some other implementations, computing device 110 may perform operations associated with the different types of equipment at least partially concurrently (e.g., in parallel). In some other implementations, computing device 110 may only perform operations associated with a particular type of equipment if initiated by a user.

Adding virtual models of one or more types of equipment to design model 136 (e.g., performing the load calculation and system design phases for a particular type of equipment) may complete generation of design model 136. Computing device 110 may display, such as via a display device coupled to or included within computing device 110, a GUI that includes a visual representation of design model 136. The visual representation of design model 136 may be a 3D representation of the building design, or another type of visual representations, such as an AR or VR representation, as non-limiting examples. The GUI may enable a user to configure one or more aspects of the display, such as to view different portions of the building design (e.g., from different viewpoints), to control viewing options such as magnification or zoom level, viewing angle, display of occluded objects, to display textual information such as room dimensions, lists of equipment, lists of furniture, fixtures, or other objects, to configure other aspects, or a combination thereof. Computing device 110 may store design model 136, such as at memory 114 or at an external storage device or network storage location, for use during the construction project to build the building. Additionally, or alternatively, computing device 110 may transmit design model 136 to another device for use during the construction project. In some implementations, computing device 110 may initiate one or more operations based on design model 136, such as initiating an order for furniture, equipment, fixtures, or other objects included in design model 136, determining a budget for the construction project, or scheduling a timeline for the construction project, as non-limiting examples.

In some implementations, computing device 110 may modify one or more aspects of design model 136 if a change is made to the building design or criteria 132, either during the initial generation of design model 136 or after completion of design model 136. To illustrate, computing device 110 may receive an input (e.g., one or more of inputs 170) that indicates a modification to the building design or the construction project, such as a modified criterion, modified layout information, modified selected equipment, or a combination thereof, as non-limiting examples. Computing device 110 may modify one or more parameters associated with a particular stage of generation of design model 136 based on the modification. Additionally, computing device 110 may modify one or more parameters associated with a "downstream" stage of generation of design model 136. As used herein, a downstream stage refers to a stage that is performed after another stage or that uses outputs of another stage as inputs. Computing device 110 may modify aspects of the stages to update design model 136 based on the modification. For example, computing device 110 may update dimensions and/or layout of one or more rooms within design model 136, furniture, fixtures, or other items included in design model 136, locations, properties, and routing of the selected equipment and associated connections within design model 136, other aspects of design model 136, or a combination thereof. Any such updates may be propagated through a remainder of the design process such that additional updates may be triggered. In some implementations, computing device 110 may update design model 136 in real-time/substantially real-time (e.g., accounting for processing needs of the various aspects being utilized). After updating design model 136 based on the modification (including updating one or more aspects), display of the visual representation of design model 136 may be updated to account for any modifications.

As a particular illustrative example, computing device 110 may receive a modified criterion, such as a modified room area criterion. If the modified criterion is not satisfied by the floor plan associated with design model 136, computing device 110 may modify the floorplan to satisfy the modified criterion. Modifying the floorplan may include generating a new 2D model (e.g., floorplan) and generating a new 3D model based on the new 2D model or modifying the location of one or more walls (or other elements) of design model 136 to represent the modified floorplan. Additionally, computing device 110 may determine whether to modify any aspects of the equipment included in design model 136 based on the modified floorplan. For example, computing device 110 may perform a load analysis based on the modified floorplan, and if the a difference between the new load analysis and the previous load analysis satisfies a threshold, computing device 110 may modify properties, locations, and/or routing of the selected equipment and associated connections based on the new load analysis. This process may be performed for each type of equipment for which a difference between a new load analysis and a previous load analysis satisfies a respective threshold. After completion of the modifications to design model 136, display of design model 136 may be updated to represent then modified floorplan and any modifications related to selected equipment. In other examples, less modifications may be made to design model 136. For example, if a particular HVAC equipment is unavailable for purchase, the design engineer may use I/O device 124 to select different HVAC equipment. Based on this modification to the selected HVAC equipment, computing device 110 may modify the properties, locations, and routing of HVAC equipment and associated air ducts. Such modification may trigger a modification to selected electrical equipment, but is unlikely to trigger modifications to room layout, furniture selection, or selected plumbing equipment.

According to one aspect, a system for dynamic generation of a design model is described. The system includes at least one memory (e.g., 114) storing instructions and one or more processors (e.g., 112) coupled to the at least one memory. The one or more processors are configured to execute the instructions to cause the one or more processors to receive a first input (e.g., 170) that indicates one or more criteria (e.g., 132) associated with the building and layout information (e.g., 134) for the building. Execution of the instructions also cause the one or more processors to generate the design model (e.g., 136) for the building based on the one or more criteria and the layout information. The design model indicates dimensions and a layout of one or more rooms within the building. Execution of the instructions cause the one or more processors to perform a load analysis based on the design model. Execution of the instructions cause the one or more processors to receive a second input (e.g., 170) that indicates selected equipment based on the load analysis. Execution of the instructions also cause the one or more processors to update the design model to include locations and connections of the selected equipment within the one or more rooms. Execution of the instructions further causes the one or more processors to initiate display of a UI that includes a visual representation of the design model.

According to another aspect, a computer program product is described that includes a computer-readable storage device, such as a non-transitory computer-readable storage medium, that includes instructions that, when executed by one or more processors (e.g., 112), cause the one or more processors to perform operations for generation of a design model of a building for a construction project. The operations include executing a first routine to receive a first input (e.g., 170) that indicates one or more criteria (e.g., 132) associated with the building and layout information (e.g., 134) for the building. The operations also include executing a second routine to generate the design model (e.g., 136) for the building based on the one or more criteria and the layout information. The design model indicates dimensions and a layout of one or more rooms within the building. The operations include executing a third routine to perform a load analysis based on the design model. The operations include executing a fourth routine to receive a second input (e.g., 170) that indicates selected equipment based on the load analysis. The operations also include executing a fifth routine to update the design model to include locations and connections of the selected equipment within the one or more rooms. The operations further include executing a sixth routine to initiate display of a user interface UI that includes a visual representation of the design model.

As described with reference to FIG. 1, system 100 generates design model 136 for a building to be built by a construction project. Generating design model 136 may include generating candidate floorplans 144 (e.g., 2D models) and generating a 3D model based on a selected candidate floorplan. Generating the 3D model automatically (e.g., based on a selected candidate floorplan) may increase speed and reduce user input used to generate the 3D model as compared to other building design systems that require a user to manually design a 2D floorplan and then manually generate a 3D model based on the 2D floorplan. Additionally, or alternatively, generating design model 136 may include system 100 determining locations, properties, and routing of selected equipment and associated connections within the building, and adding virtual models of the selected equipment and associated connections to design model 136. Because system 100 automatically performs these operations, such as using ML model 146, system 100 may increase the speed and reduce the user input used to generate design model 136, as compared to other building design systems that require a user to manually determine the properties, locations, and routing of equipment and associated connections. Reducing the user input used during generation of design model 136 may also reduce cost of the building design process, in addition to reducing the likelihood that criteria 132 are not satisfied (e.g., due to human error). Additionally, system 100 may modify design model 136 to account for changes to the building design without requiring the various users to modify, or potentially generate entirely new, designs for their respective areas of expertise. Reducing user input, and preventing users from having to redo their work if there is a change to the building design, reduces the cost and time associated of with adapting to changes in the building design, which improves the efficiency and profitability of the construction project.

FIGS. 2A-2D illustrate example views of a GUI configured to enable selection of equipment and automatic inclusion of the equipment in a design model of a building according to one or more aspects. In some implementations, the GUI may be displayed via a display device coupled to display interface 120 of computing device 110 of FIG. 1.

Referring to FIG. 2A, a first view 200 of a GUI is shown. First view 200 includes a design model window 202, an equipment selection window 210, and a load analysis window 218. Design model window 202 includes a visual representation of a design model of a building, such as design model 136 of FIG. 1. Although shown in FIG. 2A as a 2D model, in other implementations, design model window 202 may display a 3D model. As shown in FIG. 2A, the design model may include a layout of rooms (or other spaces) in the building, virtual models of furniture (or other objects) within the rooms, such as counters, tables, chairs, and the like, and/or other details of the building design. In some implementations, one or more elements of the design model may be labeled, such as rooms, furniture, etc.

Equipment selection window 210 may include a list of equipment that may be selected for inclusion in the design model (e.g., in the building design). For example, the list of equipment may include one or more types of equipment, vendors of equipment, models or families of equipment, or the like, such as illustrative equipment identifier 212. As described with reference to FIG. 1, the equipment may include HVAC equipment, electrical equipment, plumbing equipment, or any other type of equipment that is to be included in the building. Selection of equipment identifier 212 may cause display of an image 214 corresponding to equipment identifier 212 and/or equipment information 216 corresponding to equipment identifier 212. Equipment information 216 may include any information associated with the equipment represented by equipment identifier 212, such as a name, dimensions of the equipment, operating characteristics, and the like. In some implementations, image 214 and/or equipment information 216 may be retrieved from equipment specifications that correspond to equipment identifier 212, such as equipment specifications retrieved from a database or from a vendor device.

Load analysis window 218 may display load analysis data 219 generated during performance of a load analysis based on the design model, such as load analysis data 138 of FIG. 1. In some implementations, the load analysis may be performed for a heating and cooling load, an electrical load, a plumbing load, or another type of load associated with the design model. Load analysis data 219 may include text, numerical data, graphs or other visual representations of data, or a combination thereof. Presentation of load analysis data 219 may assist a user in deciding which equipment (e.g., which type, vendor, model, etc.) to include in the building.

In some implementations, the list of equipment may include only equipment that is capable of matching the load requirements indicated by load analysis data 219 (e.g., that satisfies load analysis data 219). Alternatively, the list of equipment may include all equipment options available to the computing device, and one or more equipment options that fail to match the load requirements may be indicated to the user, such as via display in a different color or another visually identifiable characteristic. In some implementations, upon selection of equipment identifier 212 from the list of equipment, in addition to displaying image 214 and equipment information 216 in equipment selection window 210, load analysis window 218 may include information comparing operating characteristics of the equipment to the load requirements and/or otherwise display how operating characteristics of the equipment satisfy the load requirements. After viewing image 214, equipment information 216, and load analysis data 219, the user may finalize selection of equipment identifier 212 or may select a different equipment identifier from the list of equipment.

Referring to FIG. 2B, a second view 220 of the GUI is shown. Second view 220 may be displayed after confirmation of a selection of equipment in equipment selection window 210. After selection of equipment, the computing device may determine locations and properties, such as dimensions, of the selected equipment based on the load analysis, the design model, and criteria, as described with reference to FIG. 1. Upon completion of the determinations, the computing device may add virtual models of the selected equipment to design model window 202. For example, as shown in FIG. 2B, virtual models of first equipment 222, second equipment 224, and third equipment 226 may be added to design model window 202. Equipment 222-226 may include components, devices, or the like, of the selected equipment. As an illustrative example, if the selected equipment is Vendor A's HVAC equipment, first equipment 222 may include or correspond to a variable air volume (VAV) box, and second equipment 224 and third equipment 226 may include or correspond to air terminals. The VAV box may have virtual connections for connecting with the air terminals, as well as connections for connecting to architectural elements of the building (e.g., walls, windows, etc.) and/or electrical equipment (control panels, power outlets, circuit breakers, power boards, etc.).

Figure 2D:
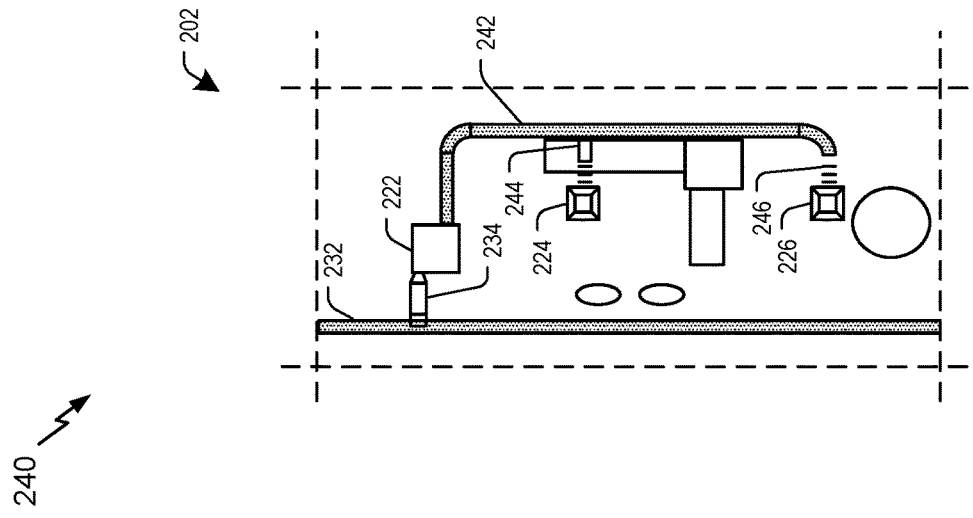
Figure 2C:
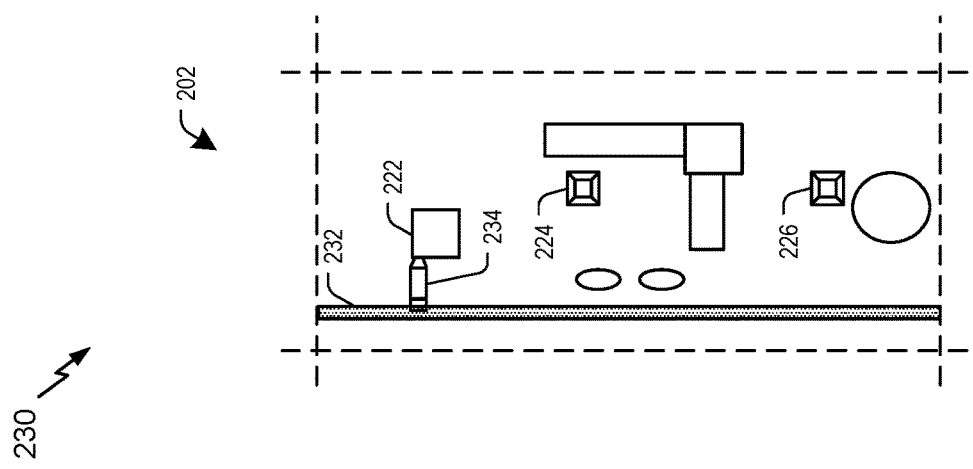

Referring to FIG. 2C, a third view 230 of the GUI is shown. Third view 230 may display a partially connected equipment system corresponding to the selected equipment. For example, connections between one or more of the selected equipment may be displayed. In the example shown in FIG. 2C, the selected equipment includes an HVAC system, and the computing device may determine locations, properties (e.g., dimensions, etc.), and routing of air ducts (e.g., connections) for connecting to equipment 222-226. The determinations may be based on equipment specifications for the selected equipment, pre-stored engineering rules, other information, or a combination thereof, as described with reference to FIG. 1. After completing the determinations, the computing device may add virtual models of the connections in design model window 202. As shown in FIG. 2C, first equipment 222 (e.g., the VAV box) may be connected to main air duct 232 via an interface 234, such as an inlet, an outlet, or the like. However, second equipment 224 and third equipment 226 (e.g., the air terminals) remain unconnected.

Referring to FIG. 2D, a forth view 240 of the GUI is shown. Fourth view 240 may display a fully connected equipment system corresponding to the selected equipment. For example, all connections between the selected equipment may be displayed. In the example shown in FIG. 2D, the selected equipment includes an HVAC system, and the computing device may determining locations, properties (e.g., dimensions, etc.), and routing of the remaining air ducts for connecting to equipment 224-226. The determinations may be based on equipment specifications for the selected equipment, pre-stored engineering rules, other information, or a combination thereof, as described with reference to FIG. 1. After completing the determinations, the computing device may add virtual models of the connections in design model window 202. As shown in FIG. 2D, second equipment 224 (e.g., an air terminal) may be connected to an air duct 242 via interface 244 (e.g., an inlet, an outlet, or the like), and third equipment 226 may be connected to air duct 242 via an interface 246. Although FIGS. 2A-D describe adding HVAC equipment to a design model, similar operations may be performed to add electrical equipment (e.g., power outlets, circuit breakers, power boards, etc.) and associated wiring, plumbing equipment (e.g., bathtubs, sinks, showers, etc.) and associated pipes, telecommunication equipment (e.g., phones, fax machines, modems, routers, electronic devices, etc.) and associated cables, other equipment and associated connections, or a combination thereof.

FIGS. 3A-3D illustrate example views of a GUI configured to enable selection and positioning of rooms for generating a design model of a building according to one or more aspects. In some implementations, the GUI may be displayed via a display device coupled to display interface 120 of computing device 110 of FIG. 1. The GUI of FIGS. 3A-D may include or correspond to the interactive GUI that enables a user to design a preliminary floorplan (e.g., 2D model) of a building, as described with reference to FIG. 1.

Figure 3A:
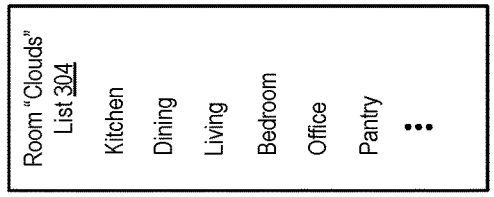
FIGS. 3A-3D illustrate example views of a GUI configured to enable selection and positioning of rooms for generating a design model of a building.
Figure 3A:
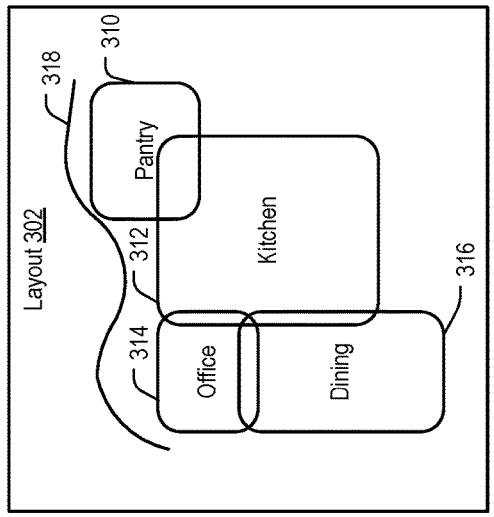
Figure 3A:
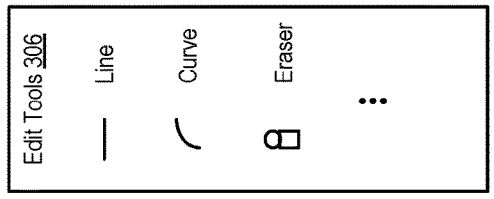

Referring to FIG. 3A, a first view 300 of a GUI is shown. First view 300 includes a layout window 302, a rooms list 304 (also referred to as room "clouds"), and an edit tools window 306. Layout window 302 displays a representation of a building (e.g., a top-down view) and may be interacted with by a user to define a preliminary floorplan. Rooms list 304 includes a list of rooms that may be added to the building design (e.g., for inclusion in a design model). For example, rooms list 304 may include a kitchen, a dining room, a living room, a bedroom, an office, a pantry, other rooms, or a combination thereof. In some implementations, rooms list 304 includes a predetermined set of rooms, which optionally may be based on a type of the building being designed. Additionally, or alternatively, rooms list 304 may include an entry to enable addition of one or more user-created room types. Edit tools window 306 may include one or more tools for defining or editing the layout of the rooms in the floorplan. For example, edit tools window may include a line tool configured to create a line in layout window 302, a curve tool configured to create a curve in layout window 302, an eraser tool configured to remove element(s) from layout window 302, other tools, or a combination thereof.

To create the preliminary floorplan, a user may select one or more room types from room list 304. Upon selection of a room type, a selectable shape corresponding to the selected room type is displayed in layout window 302. The selectable shapes may include squares, rectangles, rounded polygons, circles, ellipses, other shapes, or a combination thereof. The user may use the selectable shape to define the preliminary floorplan. For example, the user may define target dimensions of the room by increasing or decreasing a length or width of the selectable shape. As another example, the user may define a target location of the room by moving the selectable shape within layout window 302. Similar operations may be performed for additional rooms. The user may also define other shapes, such as lines, curves, etc., to be used in determining a floorplan by the computing device by using one or more tools from edit tools window 306 to create the shapes within layout window 302.

In the example shown in FIG. 3A, layout window 302 includes selectable shapes for a pantry 310, a kitchen 312, an office 314, and a dining room 316. In some implementations, selectable shapes for each room type may be indicated using different colors, different shadings, or other visual indicators. Each of the selectable shapes may be positioned and sized based on user input (e.g., selection of the corresponding room type in rooms list 304, adjustment of the length and/or width of each selectable shape, and placement of each selectable shape within layout window 302). Layout window 302 also includes a curve 318. Curve 318 may be created using one or more tools within edit tools window 306, and curve 318 may be used by the computing device to define walls of one or more of the rooms 310-316, as further described below. Once the user has completed the preliminary floorplan, the user may select a confirmation button to cause the computing device to begin generation of a floorplan (e.g., a 2D model) based on that preliminary floorplan and that satisfies criteria associated with the construction project, such as criteria 132 of FIG. 1.

Figure 3B:
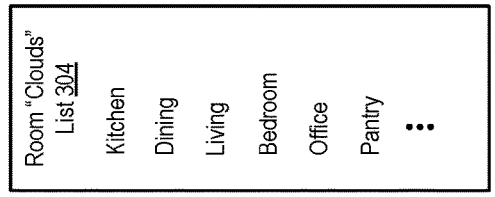
Figure 3B:
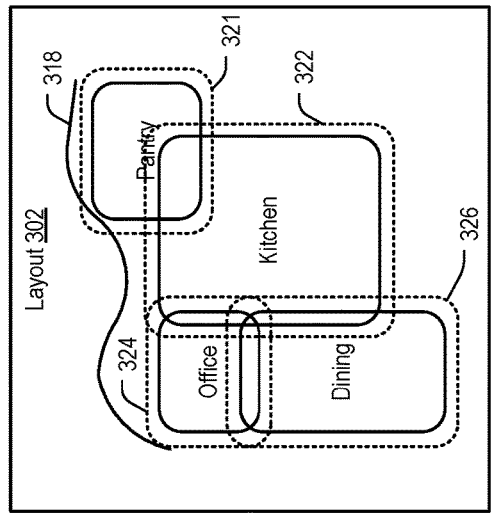
Figure 3B:
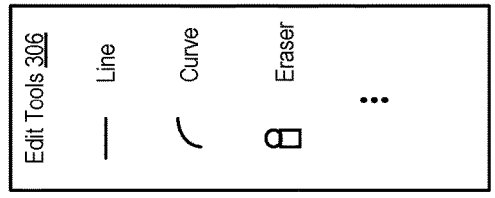

Referring to FIG. 3B, a second view 320 of the GUI is shown. In second view 320, the selectable shapes for rooms 310-316 are displayed with respective extended regions of lower probabilities. For example, pantry is surrounded by an extended region of lower probability 321, kitchen 312 is surrounded by an extended region of lower probability 322, office 314 is surrounded by an extended region of lower probability 324, and dining room 316 is surrounded by an extended region of lower probability 326. An extended region of lower probability associated with a particular room indicates a region where permissible modifications to the preliminary layout of the particular room may be made by the computing device in order to generate a floorplan that satisfies the criteria. For example, the computing device may modify the shape of the particular room such that one or more of the edges of the shape are relocated within the region of lower probability. In some implementations, such modification, although permissible, will only occur if the modification is necessary to satisfy the criteria. Alternatively, such modifications may occur based on the probability associated with the region. For example, in some implementations, there may be multiple regions of lower probability surrounding a single room shape, and different regions may be associated with different corresponding probabilities. In some implementations, the distance that the region of lower probability extends from an outline of a respective room shape is the same for all room types. In some other implementations, different room types may be associated with different distances of extension of the regions of lower probabilities. Although FIG. 3B shows the extended regions of lower probability as being displayed to a user, in other implementations, the extended regions of lower probability may be known to the computing device and are not displayed to the user.

Figure 3C:
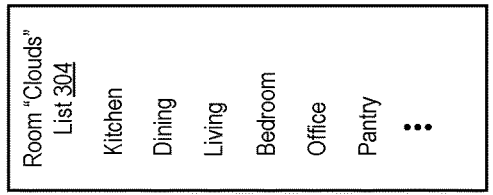
Figure 3C:
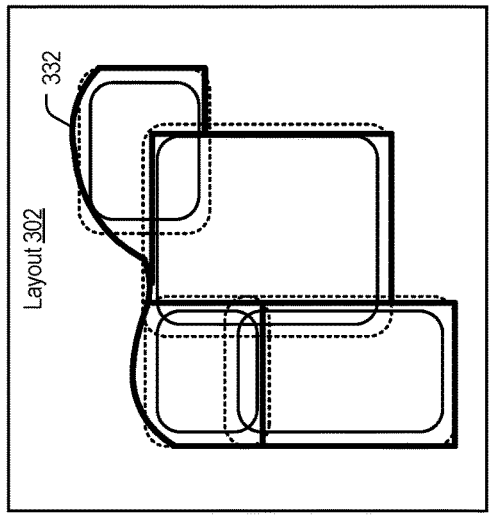
Figure 3C:
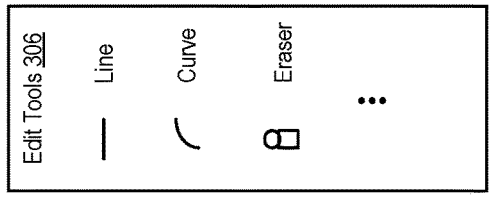

Referring to FIG. 3C, a third view 330 of the GUI is shown. In third view 330, layout window 302 includes walls 332 of the selected rooms, in addition to the selectable shapes of rooms 310-316 and extended regions of lower probability 320-326. The computing device may generate walls 332 based on rooms 310-316, extended regions of lower probability 320-326, curve 318, and the criteria. To illustrate, the computing device may modify the dimensions of one or more of rooms 310-316 to satisfy the criteria. For example, the computing device may increase a width of dining room 316 such that the walls of dining room 316 are located within extended region of lower probability 326. The increase in width may be based on a criterion that indicates a minimum required area for a dining room, as a non-limiting example. As another example, the computing device may reduce an area of pantry 310 based on overlap between pantry 310 and kitchen 312. Additionally, or alternatively, the computing device may modify the shape of one or more rooms based on additional elements in layout window 302. For example, the computing device may modify the upper walls of pantry 310 and office 314 to substantially conform to curve 318 (while still satisfying the criteria). By modifying the preliminary floorplan based on user-created elements, the computing device enables the user to have more control in designing rooms than would otherwise be possible using predefined selectable shapes. Although FIG. 3C shows walls 332 being displayed with rooms 310-316 and extended regions of lower probability 320-326, in other implementations, the display shown in FIG. 3C is for description only and is not displayed to the user.

Figure 3D:
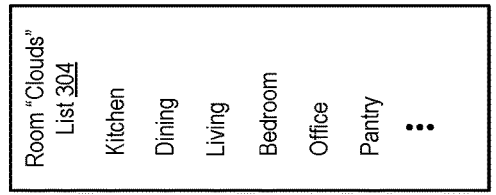
Figure 3D:
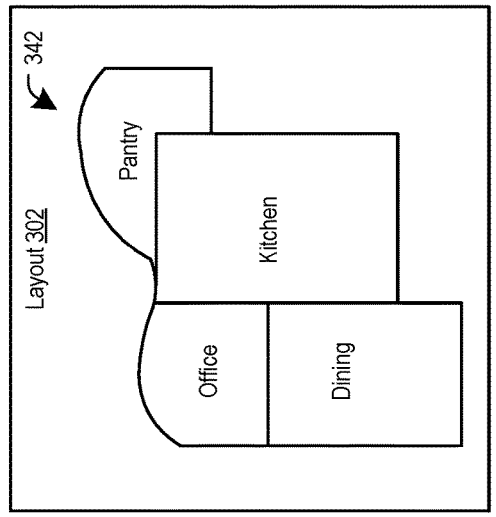
Figure 3D:
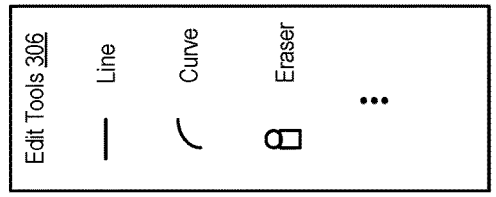

Referring to FIG. 3D, a fourth view 340 of the GUI is shown. In fourth view 340, layout window 302 includes a floorplan 342 that is generated by the computing device. Floorplan 342 may indicate the layout of the selected rooms and one or more walls between the selected rooms. The one or more walls may include or correspond to walls 332 of FIG. 3C. As described above, floorplan 342 is generated based on the preliminary floorplan created by the user and satisfies the criteria for the construction project. For example, one or more modifications may be made to the preliminary floorplan in order to satisfy the criteria and generate floorplan 342. In some implementations, additional information, such as text labels of rooms and/or other details may be displayed in layout window 302. Additionally, or alternatively, floorplan 342 may include additional elements, such as one or more hallways, one or more doorways, one or more windows, one or more stairways, furniture or fixtures included within the rooms, or a combination thereof. The computing device may automatically determine the additional elements to be included, such as based on the criteria, and virtual models of the additional elements may be added to floorplan 342. Alternatively, the GUI may include additional selectable elements, such as selectable icons for doors, windows, stairs, furniture, and the like, and one or more of the additional elements may be added based on user input. Floorplan 342 may be used to generate a 3D model of the building, or floorplan 342 may be an example of one of candidate floorplans 144 described with reference to FIG. 1 that are displayed to enable user selection of a floorplan.

Figure 4:
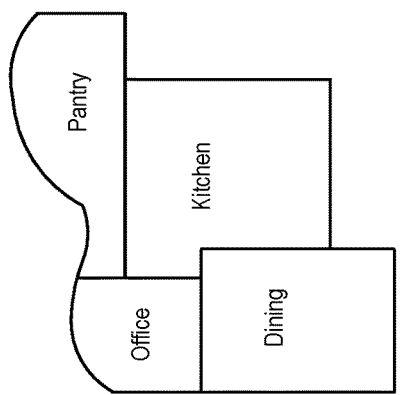
FIG. 4 illustrates an example view of a GUI configured to enable selection of a generated two-dimensional (2D) layout for generating a design model of a building.
Figure 4:
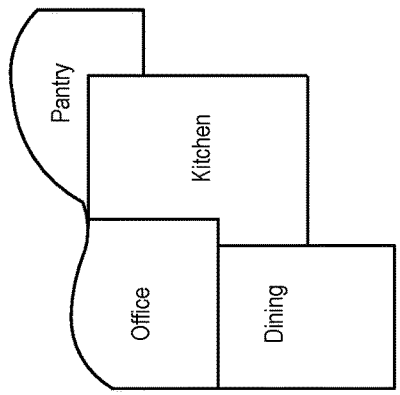
Figure 4:
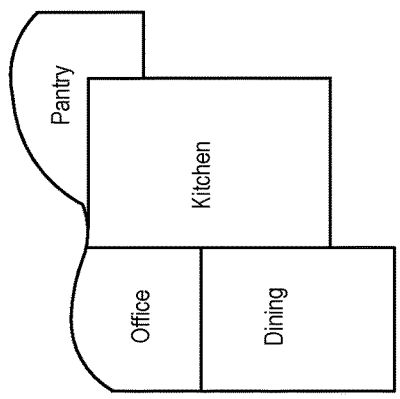

Referring to FIG. 4, an example view 400 of a GUI configured to enable selection of a generated 2D layout for generating a design model of a building according to one or more aspects is shown. In some implementations, the GUI may be displayed via a display device coupled to display interface 120 of computing device 110 of FIG. 1.

View 400 includes multiple candidate floorplans generated by the computing device. The multiple candidate floorplans may include or correspond to candidate floorplans 144 of FIG. 1 or multiple candidate floorplans generated as described with reference to FIGS. 3A-D, such as floorplan 342. As shown in FIG. 4, the multiple candidate floorplans include a first candidate floorplan 402, a second candidate floorplan 404, and a third candidate floorplan 406. Although three candidate floorplans are shown, in other implementations, view 400 includes fewer than three or more than three candidate floorplans. Each candidate floorplan may be generated based on a user-created preliminary layout (e.g., layout information), with optional modifications to satisfy criteria associated with a construction project to build the building, as described with reference to FIGS. 3A-D. Each of candidate floorplans 402-406 may be different while still satisfying the criteria, such as including different wall placements, different room sizes, different room locations, different furniture, and the like. A user may select one of candidate floorplans 402-406 for generation, by the computing device, of a 3D model of the building (e.g., a design model). In some implementations, view 400 may include a more layouts button 408 that is selectable based on user input to reject candidate floorplans 402-406 and cause the computing device to generate additional candidate floorplans.

Figure 5:
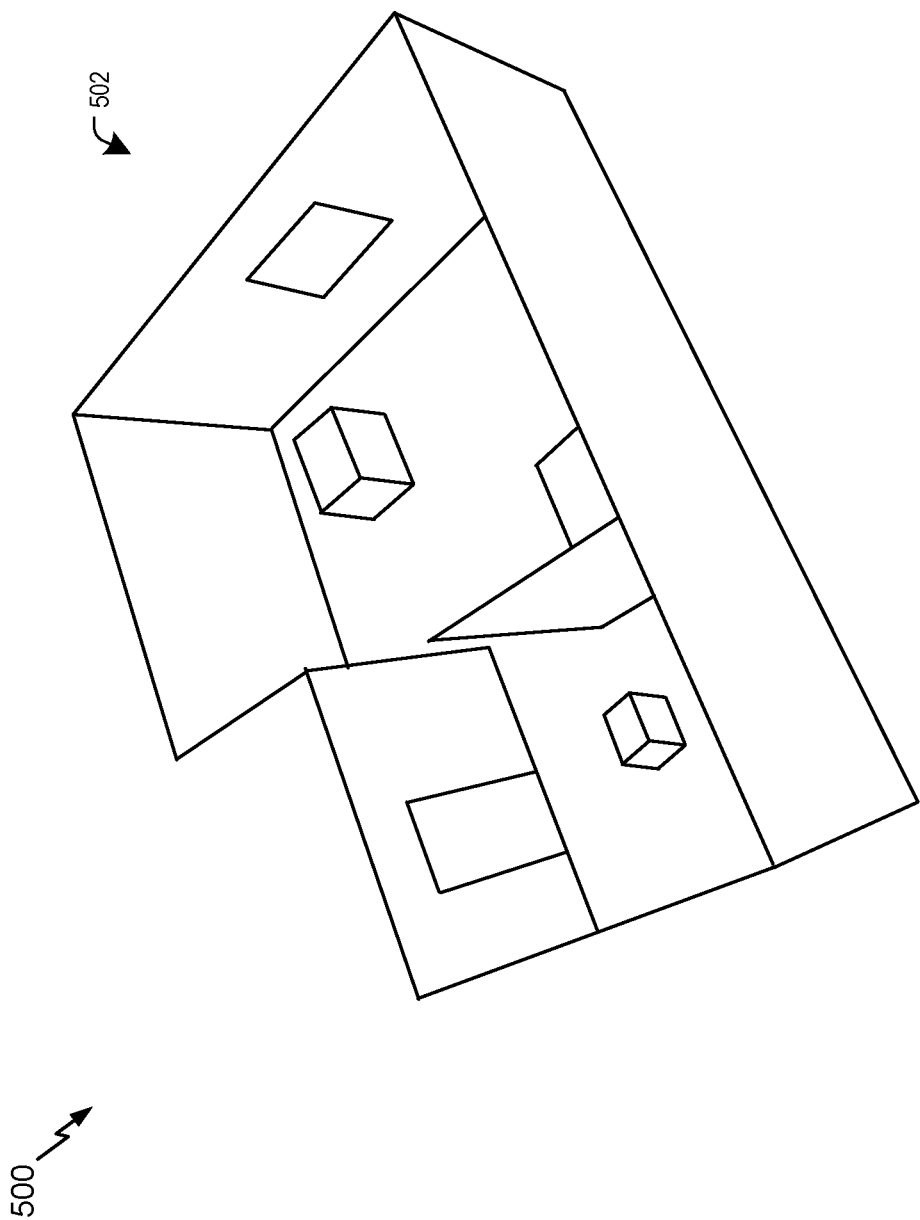
FIG. 5 illustrates an example view of a GUI configured to display a three-dimensional (3D) layout of a design model for a building based on a selected 2D layout.

Referring to FIG. 5, an example view 500 of a GUI configured to display a 3D layout of a design model of a building according to one or more aspects is shown. In some implementations, the GUI may be displayed via a display device coupled to display interface 120 of computing device 110 of FIG. 1.

View 500 includes a 3D model 502. 3D model 502 may be generated based on a selected candidate floorplan, as described with reference to FIG. 4. In some implementations, 3D model 502 is automatically generated by the computing device (e.g., without user input, such as input to a 3D CAD application). 3D model 502 may display a layout of rooms within the building, walls that separate the rooms, doors between rooms and/or exterior doors, windows, furniture, fixtures, other objects, or a combination thereof. To illustrate, virtual models of furniture, such as a virtual model of a table or a virtual model of a chair, as non-limiting examples, may be included in 3D model 502. 3D model 502 may also include virtual models of selected equipment and associated connections, which may be automatically generated and added by the computing device, as further described with reference to FIG. 1. In some implementations, view 500 may include one or more configurable options, such as a magnification option, a view angle option, an option to show occluded elements (or outlines of occluded elements), other options, or a combination thereof. Additionally, or alternatively, a user may be able to view different portions of 3D model 502 using an I/O device, such as by clicking and dragging with a mouse or performing one or more gestures, as non-limiting examples.

Figure 6:
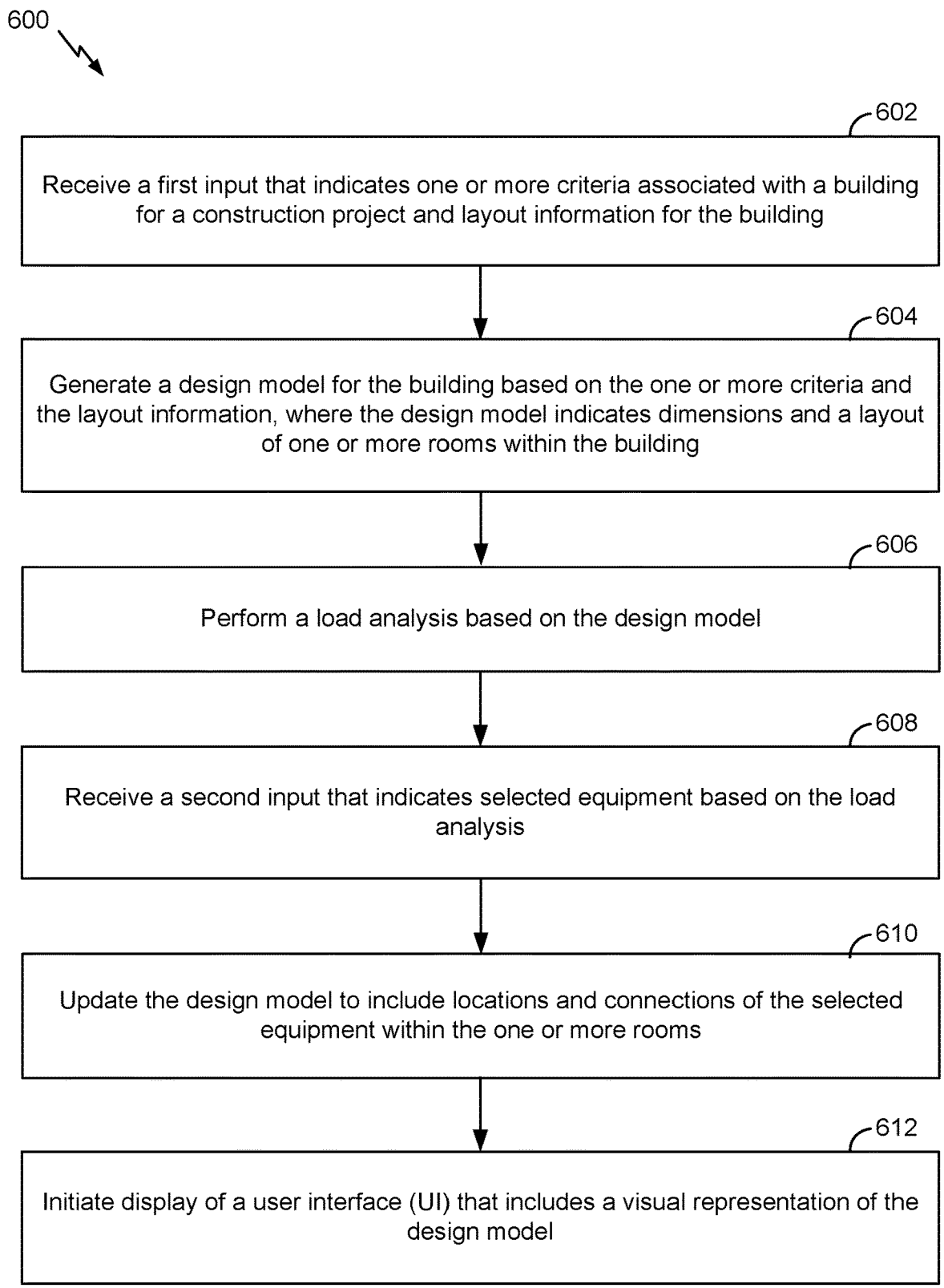
FIG. 6 is a flow diagram of an example of a method for dynamically generating a design model of a building for a construction project.

Referring to FIG. 6, a flow diagram of a method for dynamically generating a design model of a building for a construction project according to one or more aspects is shown as a method 600. In some implementations, method 600 may be performed by computing device 110 of FIG. 1. In some implementations, method 600 may be stored in a computer-readable storage medium as instructions that, when executed by one or more processors, cause the one or more processors to perform the operations of method 600.

At 602, method 600 includes receiving a first input that indicates one or more criteria associated with a building for a construction project and layout information for the building. For example, the first input may include or correspond to one of inputs 170, the one or more criteria may include or correspond to criteria 132, and the layout information may include or correspond to layout information 134 of FIG. 1. At 604, method 600 includes generating a design model for the building based on the one or more criteria and the layout information. The design model indicates dimensions and a layout of one or more rooms within the building. For example, the design model may include or correspond to design model 136 of FIG. 1.

At 606, method 600 includes performing a load analysis based on the design model. For example, performance of the load analysis may generate load analysis data 138 of FIG. 1. At 608, method 600 includes receiving a second input that indicates selected equipment based on the load analysis. For example, the second input may include or correspond to one of inputs 170, and the selected equipment may be indicated by selected equipment information 140 of FIG. 1.

At 610, method 600 includes updating the design model to include locations and connections of the selected equipment within the one or more rooms. For example, computing device 110 may update design model 136 to include locations and connections between selected equipment associated with selected equipment information 140 of FIG. 1. At 612, method 600 includes initiating display of a UI that includes a visual representation of the design model. For example, computing device 110 may initiate a display of a UI that includes a visual representation of design model 136 (e.g., a 3D model of the building) via display interface 120.

In some implementations, the selected equipment may include a type of heating, ventilation, and air conditioning (HVAC) equipment, a type of electrical equipment, or a type of plumbing equipment. Additionally, or alternatively, the one or more criteria may include dimensions of a room, one or more required room types, one or more pathway criteria, one or more room access criteria, one or more building access criteria, one or more window criteria, one or more furniture criteria, or a combination thereof. Additionally, or alternatively, the design model may include a 3D model of the building that includes virtual models corresponding to the selected equipment, furniture within the one or more rooms, fixtures within the one or more rooms, one or more air ducts routed within the building, wiring routed within the building, pipes routed within the building, or a combination thereof.

In some implementations, method 600 also includes receiving a third input that indicates a modified criterion, modified layout information, modified selected equipment, or a combination thereof, updating the design model to modify the dimensions and the layout of the one or more rooms, the locations and connections of the selected equipment within the one or more rooms, or a combination thereof, based on the third input, and updating the UI based on the updated design model. For example, computing device 110 may modify one or more aspects of design model

136 based on modification data 142, such as by modifying the layout or dimensions of the rooms or the locations or dimensions of the selected equipment and/or associated connections. In some such implementations, the third input may indicate the modified criterion, and updating the design model based on the third input may include modifying the dimensions and the layout of the one or more rooms within the design model to satisfy the modified criterion, modifying one or more characteristics of the selected equipment within the design model based on the modified dimensions and layout of the one or more rooms, and modifying the locations and connections of the selected equipment within the design model based on the modified characteristics of the selected equipment, the modified dimensions and layout of the one or more rooms, or a combination thereof. For example, if modification data 142 indicates a modified room location criteria, computing device 110 may modify the layout of the rooms in design model 136, and computing device 110 may modify one or more characteristics (e.g., dimensions) and locations of selected equipment and connections between the selected equipment based on the modified layout.

In some implementations, performing the load analysis may include estimating an electrical load, a heating and cooling load, or a water load associated with the design model, and updating the design model to include locations and connections of the selected equipment within the one or more rooms may include determining dimensions of the selected equipment based on equipment specifications associated with the selected equipment and the load analysis, and adding virtual models of the selected equipment to one or more locations within the one or more rooms in the design model based on the dimensions and the equipment specifications. For example, load analysis data 138 may indicate results of analyzing an electrical load, a heating and cooling load, a water load, or another type of load, associated with design model 136, and computing device 110 may determine dimensions and/or locations of the selected equipment based on load analysis data 138 and selected equipment information 140 (e.g., including equipment specifications). Computing device 110 may add virtual models of the selected equipment to the determined locations in design model 136. In some such implementations, updating the design model to include locations and connections of the selected equipment within the one or more rooms may further include determining locations and routing of one or more connections between the selected equipment and adding virtual models of the one or more connections to the determined locations within the one or more rooms in the design model. The virtual models of the one or more connections connect the virtual models of the selected equipment. For example, if the selected equipment includes HVAC equipment, computing device 110 may add virtual models of air ducts connecting the HVAC equipment to design model 136. The locations, dimensions, and/or routing of the air ducts may be determined based on criteria 132 and selected equipment information 140. In some such implementations, determining the locations and the routing of the one or more connections between the selected equipment may include providing input data indicating the dimensions and the locations of the selected equipment to a trained machine-learning (ML) model that is configured to output locations and routings of connections between the selected equipment. For example, computing device 110 may use ML model 146 to determine the locations and/or routing of the connections between the selected equipment. As described with reference to FIG. 1, ML model 146 may be trained based on historical building design data (e.g., that includes locations, dimensions, and routing of equipment and associated connections), equipment specifications, engineering knowledge, and the like.

In some implementations, method 600 also includes initiating display of an editable floorplan of the building and initiating display of selectable shapes corresponding to rooms for inclusion in the editable floorplan. The first input may indicate selection of one or more selectable shapes and locations of the one or more selectable shapes with respect to the editable floorplan. For example, computing device 110 may initiate display of a GUI that includes layout window 302 and room list 304 of FIGS. 3A-D. In some such implementations, method 600 may further include generating multiple candidate floorplans based on the one or more selectable shapes and the locations of the one or more selectable shapes and initiating display of the multiple candidate floorplans. Each of the multiple candidate floorplans satisfies the one or more criteria. For example, computing device may initiate display of a GUI that displays multiple candidate floorplans, as described with reference to FIG. 4. Each of the candidate floorplans may be automatically generated by computing device 110, as further described with reference to FIGS. 3A-D. In some such implementations, each candidate floorplan of the multiple candidate floorplans may include a respective layout of the one or more rooms corresponding to the one or more selectable shapes, respective dimensions of the one or more rooms, layout of one or more hallways to connect the one or more rooms, and locations of one or more doors for the one or more rooms. Additionally, or alternatively, method 600 may also include receiving a fourth input indicating selection of a candidate floorplan of the multiple candidate floorplans and generating the design model based on the selected candidate floorplan. The design model may include a 3D model of the building. For example, a user may select one of candidate floorplans 402-406 of FIG. 4 to cause computing device 110 to generate design model 136 (e.g., a 3D model) based on the selected candidate floorplan. Alternatively, method 600 may further include receiving a fifth input indicating rejection of the multiple candidate floorplans, generating additional candidate floorplans based on the one or more selectable shapes, the locations of the one or more selectable shapes, and the one or more criteria, and initiating display of the additional candidate floorplans. For example, selection of more layouts button 408 of FIG. 4 may cause computing device 110 to generate and display additional candidate floorplans.

In some implementations, method 600 may further include initiating transmission of an indication of the selected equipment type to a vendor device, receiving equipment specifications from the vendor device, and adding virtual models of the selected equipment to one or more locations within the one or more rooms in the design model. The dimensions and operating characteristics of the selected equipment may be based on the equipment specifications. For example, computing device 110 may receive equipment specifications 174 from vendor device 162 for use in generating virtual models of the selected equipment. Alternatively, method 600 may further include accessing a database based on the selected equipment and the load analysis to retrieve particular equipment specifications and adding virtual models of the selected equipment to one or more locations within the one or more rooms in the design model. The dimensions and operating characteristics of the selected equipment may be based on the particular equipment specifications. For example, computing device 110 may receive equipment specifications 172 from database 160 for use in generating virtual models of the selected equipment.

In some implementations, method 600 may further include receiving a modification to the design model, modifying one or more parameters associated with a particular stage of generation of the design model based on the received modification, and modifying one or more parameters associated with a downstream stage from the particular stage based on the modification and the modified one or more parameters associated with the particular stage. For example, computing device may modify one or more parameters associated with a layout of the rooms in design model 136 based on modification data 142, and the modified layout may be used to determine whether to modify the location, properties, and/or routing of the selected equipment and associated connections within design model 136.

Thus, method 600 describes generating a design model for a building. The design model may be generated using less manpower and cost, and with improved speed, as compared to design models generated by other building design systems. For example, the design model may be generated such that the building design satisfies criteria of a construction project without requiring a user to design all the details of the building design or to manually create a 3D model of the building design. As another example, because virtual models of selected equipment are automatically added to the design model based on a load analysis, user input associated with determining locations, properties (e.g., dimensions), and routing of the selected equipment and associated connections may be reduced (or eliminated), which improves speed and reduces cost associated with the design model generation process.

In some implementations, method 600 can be combined with other operations described herein such that one or more operations described with reference to one method 600 of FIG. 6 may be combined with one or more operations described with reference to FIG. 1 or FIGS. 2A-5.

Although one or more of the disclosed figures may illustrate systems, apparatuses, methods, or a combination thereof, according to the teachings of the disclosure, the disclosure is not limited to these illustrated systems, apparatuses, methods, or a combination thereof. One or more functions or components of any of the disclosed figures as illustrated or described herein may be combined with one or more other portions of another function or component of the disclosed figures. Accordingly, no single implementation described herein should be construed as limiting and implementations of the disclosure may be suitably combined without departing from the teachings of the disclosure.

The steps of a method or algorithm described in connection with the implementations disclosed herein may be included directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient (e.g., non-transitory) storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

Although the present disclosure and its advantages have been described in detail, it should be understood that various changes, substitutions and alterations can be made herein without departing from the scope of the present disclosure as defined by the appended claims. Moreover, the scope of the present application is not intended to be limited to the particular aspects of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding aspects described herein may be utilized according to the present disclosure. Accordingly, the appended claims are intended to include within their scope such processes, machines, manufacture, compositions of matter, means, methods, or steps.

What is claimed is:

1. A method for dynamic generation of a design model of a building for a construction project, the method comprising:
   receiving, by one or more processors, a first input that indicates one or more criteria associated with the building and layout information for the building;
   generating, by the one or more processors, the design model for the building based on the one or more criteria and the layout information, where the design model indicates dimensions and a layout of one or more rooms within the building;
   performing, by the one or more processors, a load analysis based on the design model;
   displaying, by the one or more processors, selectable options for equipment that satisfies a load determined based on performance of the load analysis;
   receiving, by the one or more processors, a second input that indicates user-selected equipment from among the equipment corresponding to the selectable options;
   adding, by the one or more processors, virtual models of the user-selected equipment to one or more locations within the one or more rooms in the design model;
   updating, by the one or more processors, the design model to include connections between the virtual models of the user-selected equipment within the one or more rooms; and
   initiating display, by the one or more processors, of a user interface (UI) that includes an interactive and user-configurable visual representation of the design model.

2. The method of claim 1, where the user-selected equipment includes a type of heating, ventilation, and air conditioning (HVAC) equipment, a type of electrical equipment, or a type of plumbing equipment.

3. The method of claim 1, where the one or more criteria include dimensions of a room, one or more required room types, one or more pathway criteria, one or more room access criteria, one or more building access criteria, one or more window criteria, one or more furniture criteria, or a combination thereof.

4. The method of claim 1, further comprising:
   receiving, by the one or more processors, a third input that indicates a modified criterion, modified layout information, modified selected equipment, or a combination thereof;
   updating, by the one or more processors, the design model to modify the dimensions and the layout of the one or more rooms, the locations and connections of the user-selected equipment within the one or more rooms, or a combination thereof, based on the third input; and updating the interactive and user-configurable visual representation based on the updated design model.

5. The method of claim 4, where the third input indicates the modified criterion, and where updating the design model based on the third input comprises:
modifying the dimensions and the layout of the one or more rooms within the design model to satisfy the modified criterion;
modifying one or more characteristics of the virtual models of the user-selected equipment within the design model based on the modified dimensions and layout of the one or more rooms; and
modifying the locations and connections of the virtual models of the user-selected equipment within the design model based on the modified characteristics of the user-selected equipment, the modified dimensions and layout of the one or more rooms, or a combination thereof.

6. The method of claim 1, where performing the load analysis comprises estimating an electrical load, a heating and cooling load, or a water load associated with the design model, and further comprising:
determining dimensions of the user-selected equipment based on equipment specifications associated with the user-selected equipment and the load analysis, the virtual models of the user-selected equipment within the one or more rooms in the design model having the determined dimensions.

7. The method of claim 6, where updating the design model to include connections between the virtual models of the user-selected equipment within the one or more rooms in the design model further comprises:
determining locations and routing of one or more connections between the user-selected equipment; and
adding virtual models of the one or more connections to the determined locations within the one or more rooms in the design model, the virtual models of the one or more connections connecting the virtual models of the user-selected equipment.

8. The method of claim 1, further comprising providing input data indicating dimensions and locations of the user-selected equipment to a trained machine-learning (ML) model that is configured to output locations and routings of connections between the user-selected equipment.

9. The method of claim 1, further comprising:
initiating, by the one or more processors, display of an editable floorplan of the building; and
initiating, by the one or more processors, display of selectable shapes corresponding to rooms for inclusion in the editable floorplan,
where the first input indicates user selection of one or more selectable shapes and user selection of locations of the one or more selectable shapes with respect to the editable floorplan.

10. The method of claim 9, further comprising:
generating, by the one or more processors, multiple candidate floorplans based on the one or more selectable shapes and the locations of the one or more selectable shapes, each of the multiple candidate floorplans satisfying the one or more criteria; and
initiating, by the one or more processors, display of the multiple candidate floorplans, where each candidate floorplan of the multiple candidate floorplans includes a respective layout of the one or more rooms corresponding to the one or more selectable shapes, respective dimensions of the one or more rooms, layout of one or more hallways to connect the one or more rooms, and locations of one or more doors for the one or more rooms.

11. The method of claim 10, further comprising:
receiving, by the one or more processors, a fourth input indicating selection of a candidate floorplan of the multiple candidate floorplans; and
generating the design model based on the selected candidate floorplan, the design model including a three-dimensional (3D) model of the building.

12. The method of claim 10, further comprising:
receiving, by the one or more processors, a fifth input indicating rejection of the multiple candidate floorplans;
generating, by the one or more processors, additional candidate floorplans based on the one or more selectable shapes, the locations of the one or more selectable shapes, and the one or more criteria; and
initiating, by the one or more processors, display of the additional candidate floorplans.

13. A system for dynamic generation of a design model of a building for a construction project, the system comprising:
at least one memory storing instructions; and
one or more processors coupled to the at least one memory, the one or more processors configured to execute the instructions to cause the one or more processors to:
receive a first input that indicates one or more criteria associated with the building and layout information for the building;
generate the design model for the building based on the one or more criteria and the layout information, where the design model indicates dimensions and a layout of one or more rooms within the building;
perform a load analysis based on the design model;
initiate display of selectable options for equipment that satisfies a load determined based on performance of the load analysis;
receive a second input that indicates user-selected equipment from among the equipment corresponding to the selectable options;
add virtual models of the user-selected equipment to one or more locations within the one or more rooms in the design model;
update the design model to include connections between the virtual models of the user-selected equipment within the one or more rooms; and
initiate display of a user interface (UI) that includes an interactive and user-configurable visual representation of the design model.

14. The system of claim 13, further comprising:
one or more input/output (I/O) devices configured to receive the first input, the second input, or both; and
a display device configured to display the UI.

15. The system of claim 13, further comprising a network interface configured to communicate via a network, where execution of the instructions further causes the one or more processors to:
initiate transmission, via the network interface, of an indication of the user-selected equipment type to a vendor device;
receive equipment specifications from the vendor device based on transmitting the indication of the user-selected equipment type, where the dimensions of the virtual models of the user-selected equipment within the design model are based on the equipment specifications.

16. The system of claim 13, further comprising a database configured to store data indicating multiple equipment specifications, where execution of the instructions further causes the one or more processors to:
access the database based on the user-selected equipment and the load analysis to retrieve particular equipment specifications,
where the dimensions of the virtual models of the user-selected equipment in the design model are based on the particular equipment specifications.

17. A non-transitory computer-readable storage medium storing instructions that, when executed by one or more processors, cause the one or more processors to perform operations for dynamic generation of a design model of a building for a construction project, the operations comprising:
executing a first routine to receive a first input that indicates one or more criteria associated with the building and layout information for the building;
executing a second routine to generate the design model for the building based on the one or more criteria and the layout information, where the design model indicates dimensions and a layout of one or more rooms within the building;
executing a third routine to perform a load analysis based on the design model;
executing a fourth routine to initiate display of selectable options for equipment that satisfies a load determined based on performance of the load analysis;
executing a fifth routine to receive a second input that indicates user-selected equipment from among the equipment corresponding to the selectable options;
executing a sixth routine to add virtual models of the user-selected equipment to one or more locations within the one or more rooms in the design model;
executing a seventh routine to update the design model to include connections between the virtual models of the user-selected equipment within the one or more rooms; and
executing an eighth routine to initiate display of a user interface (UI) that includes an interactive and user-configurable visual representation of the design model.

18. The non-transitory computer-readable storage medium of claim 17, where the design model includes a three-dimensional (3D) model of the building that includes virtual models corresponding to the user-selected equipment, furniture within the one or more rooms, fixtures within the one or more rooms, one or more air ducts routed within the building, wiring routed within the building, pipes routed within the building, or a combination thereof.

19. The non-transitory computer-readable storage medium of claim 17, the operations further comprising:
executing a ninth routine to receive a user-modification to the design model;
executing a tenth routine to modify one or more parameters associated with a particular stage of generation of the design model based on the received user-modification; and
executing an eleventh routine to modify one or more parameters associated with a downstream stage from the particular stage based on the user-modification and the modified one or more parameters associated with the particular stage.

20. The method of claim 1, further comprising initiating, by the one or more processors, an operation based on the design model, the operation to purchase the user-selected equipment or to schedule construction of at least a portion of building.

* * * * *